United States Patent
Mitsumoto et al.

(10) Patent No.: US 11,605,582 B2
(45) Date of Patent: Mar. 14, 2023

(54) SEMICONDUCTOR DEVICE

(71) Applicant: Fuji Electric Co., Ltd., Kanagawa (JP)

(72) Inventors: Takahiro Mitsumoto, Nagano (JP); Akira Hirao, Nagano (JP); Motohito Hori, Nagano (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 39 days.

(21) Appl. No.: 17/391,283

(22) Filed: Aug. 2, 2021

(65) Prior Publication Data

US 2022/0077044 A1 Mar. 10, 2022

(30) Foreign Application Priority Data

Sep. 8, 2020 (JP) .............................. JP2020-150729

(51) Int. Cl.
| | |
|---|---|
| H01L 23/498 | (2006.01) |
| H01L 23/373 | (2006.01) |
| H01L 23/538 | (2006.01) |
| H01L 25/07 | (2006.01) |
| H01L 25/18 | (2006.01) |

(52) U.S. Cl.
CPC .... H01L 23/49822 (2013.01); H01L 23/3735 (2013.01); H01L 23/49833 (2013.01); H01L 23/49877 (2013.01); *H01L 25/18* (2013.01)

(58) Field of Classification Search
CPC ........... H01L 23/3735; H01L 23/49811; H01L 23/49822; H01L 23/49877; H01L 23/49833; H01L 23/5383; H01L 23/5385; H01L 25/072; H01L 25/18
See application file for complete search history.

(56) References Cited

U.S. PATENT DOCUMENTS

| | | | | |
|---|---|---|---|---|
| 2015/0179551 A1* | 6/2015 | Nakamura | ........ | H01L 23/49844 257/773 |
| 2015/0221525 A1* | 8/2015 | Otsuki | .............. | H01L 23/49811 164/98 |
| 2015/0223339 A1 | 8/2015 | Nakamura et al. | | |
| 2018/0145007 A1* | 5/2018 | Hatano | ............. | H01L 23/49861 |
| 2018/0269708 A1* | 9/2018 | Yeh | ...................... | H01L 23/5386 |
| 2019/0393161 A1* | 12/2019 | Zhong | ............... | H01L 23/49866 |

FOREIGN PATENT DOCUMENTS

| | | |
|---|---|---|
| JP | 2011-176558 A | 9/2011 |
| JP | 2019-71399 A | 5/2019 |
| WO | 2014/061211 A1 | 4/2014 |

* cited by examiner

*Primary Examiner* — Omar F Mojaddedi
(74) *Attorney, Agent, or Firm* — Chen Yoshimura LLP

(57) ABSTRACT

A semiconductor device includes a wiring board that includes a first insulating layer, a first conductive layer arranged over the first insulating layer, a second conductive layer arranged under the first insulating layer, the wiring board further including a magnetic layer that is arranged between the first insulating layer and the first or second conductive layer and that has a higher specific magnetic permeability than the first and second conductive layers, and a carbon layer that is arranged between the first insulating layer and the first or second conductive layer and that has a higher thermal conductivity in a planary direction than the first and second conductive layers; a semiconductor chip electrically connected to the first and second conductive layers; and an insulating circuit board arranged separately from the wiring board and that has the semiconductor chip mounted thereon.

17 Claims, 18 Drawing Sheets

SEMICONDUCTOR DEVICE

BACKGROUND OF THE INVENTION

Technical Field

The present invention relates to a semiconductor device (semiconductor module).

Background Art

As a semiconductor device used for a power conversion device or the like, a semiconductor device in which a plurality of semiconductor elements mounted on an insulating circuit board are electrically connected via a printed circuit board is known (Patent Document 1). In the semiconductor device described in Patent Document 1, a wiring board in which an insulating plate is sandwiched between a first conductive layer and a second conductive layer is used, and an electric current is applied to each of the first and second conductive layers in order to achieve a sufficient current volume.

Further, in Patent Document 2, a transmission line structure chip built into a low-pass filter is constructed of a first double-layer metal leaf, a second double-layer metal leaf, and an insulator layer formed between the first and second double-layer metal foils, and a graphite layer and a silver paste layer are sequentially arranged on the outer periphery of an enamel copper wire. Further, Patent Document 3 discloses a power module that includes an insulating substrate, a semiconductor device arranged on the insulating substrate, and a graphite plate that has an anisotropic thermal conductivity in which one end is connected to the surface side of the semiconductor device and the other end is connected to the insulating substrate so as to transfer heat on the surface side of the semiconductor device to the insulating substrate via the graphite plate.

RELATED ART DOCUMENT

Patent Document
Patent Document 1: PCT International Application Publication No. 2014/061211
Patent Document 2: Japanese Patent Application Laid-Open Publication No. 2011-176558
Patent Document 3: Japanese Patent Application Laid-Open Publication No. 2019-71399

SUMMARY OF THE INVENTION

In the semiconductor device described in Patent Document 1, when a high-frequency current (pulse current) is applied to each of the first and second conductive layers of the wiring board, a skin effect occurs in which a current is generated only in the vicinity of the respective surfaces of the first and second conductive layers. Due to this skin effect, the circuit resistance of the first and second conductive layers increases, the Joule heat generation in the first and second conductive layers increases, and the temperature of the first and second conductive layers rises. When the temperature rise of the first and second conductive layers is large, it is necessary to increase the area of the first and second conductive layers, which hinders the miniaturization of the wiring board and eventually hinders the miniaturization of the semiconductor device.

In view of the above problems, it is an object of the present invention to provide a semiconductor device capable of suppressing a temperature rise of a conductive layer when a high frequency current is applied to the conductive layer of a wiring board.

Additional or separate features and advantages of the invention will be set forth in the descriptions that follow and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, in one aspect, the present disclosure provides a semiconductor device, including: a wiring board that includes a first insulating layer, a first conductive layer arranged on a side of one main surface of the first insulating layer, a second conductive layer arranged on a side of another main surface of the first insulating layer, the wiring board further including a magnetic layer that is arranged between the first insulating layer and the first conductive layer or between the first insulating layer and the second conductive layer and that has a higher specific magnetic permeability than the first and second conductive layers, and a carbon layer that is arranged between the first insulating layer and the first conductive layer or between the first insulating layer and the second conductive layer and that has a higher thermal conductivity in a planary direction than the first and second conductive layers; a semiconductor chip electrically connected to the first and second conductive layers; and an insulating circuit board arranged separately from the wiring board and that has the semiconductor chip mounted thereon.

According to the present invention, it is possible to provide a semiconductor device capable of suppressing a temperature rise of a conductive layer when a high frequency current is applied to the conductive layer of a wiring board.

It is to be understood that both the foregoing general description and the following detailed description are exemplary and explanatory, and are intended to provide further explanation of the invention as claimed.

DETAILED DESCRIPTION OF EMBODIMENTS

Figure 1:
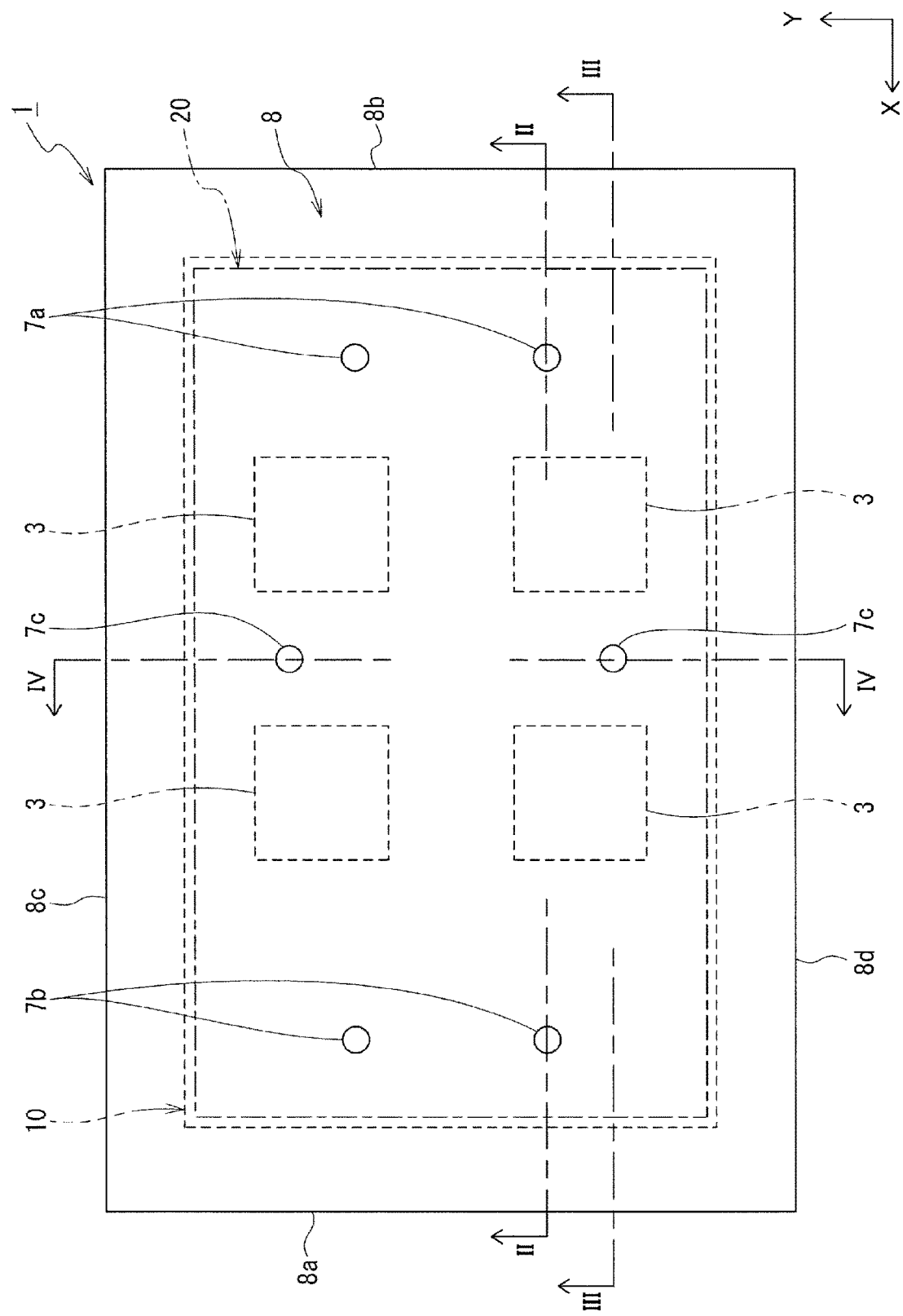
FIG. 1 is a schematic plan view of a semiconductor device according to an embodiment of this invention.

Hereinafter, an embodiment and first to seventh modifications of the embodiment will be described with reference to the drawings. In the description of the drawings, the same or similar parts are designated by the same or similar reference numerals, and duplicate description will be omitted. Further, the drawings are schematic, and the relationship between the thickness and the planary dimensions, the ratio of the thicknesses of the respective layers, etc., may differ from the actual ones. In addition, different drawings may depict corresponding parts with different dimensional relationships and ratios. Further, the following embodiment and the first to seventh modifications exemplify devices and methods for embodying the technical idea of the present invention, and do not unduly limit the technical idea of the present invention by these specific material, shape, structure, and arrangements, etc., unless explicitly stated otherwise.

Further, in the following embodiment and the first to seventh modifications, the "first main electrode" means an electrode serving as an emitter electrode or a collector electrode in the case of an insulated gate bipolar transistor (IGBT), and means an electrode serving as a source electrode or a drain electrode in the case of a field effect transistor (FET) and a static induction transistor (SIT). The "second main electrode" means an emitter electrode or a collector electrode that does not become the first main electrode in the case of IGBT, and a source electrode or a drain electrode that does not become the first main electrode in the case of FET or SIT. In the following embodiment and the first to seventh modifications, MOSFETs as transistor elements will be illustrated, and the first main electrode will be described as a drain electrode and the second main electrode will be described as a source electrode.

Further, in the following embodiment and the first to seventh modifications, the first and second directions orthogonal to each other in the same plane are defined as the X direction and the Y direction, respectively, in the three directions orthogonal to each other in the space. The third direction orthogonal to the first direction and the second direction is defined as the Z direction.

Embodiment

Figure 2:
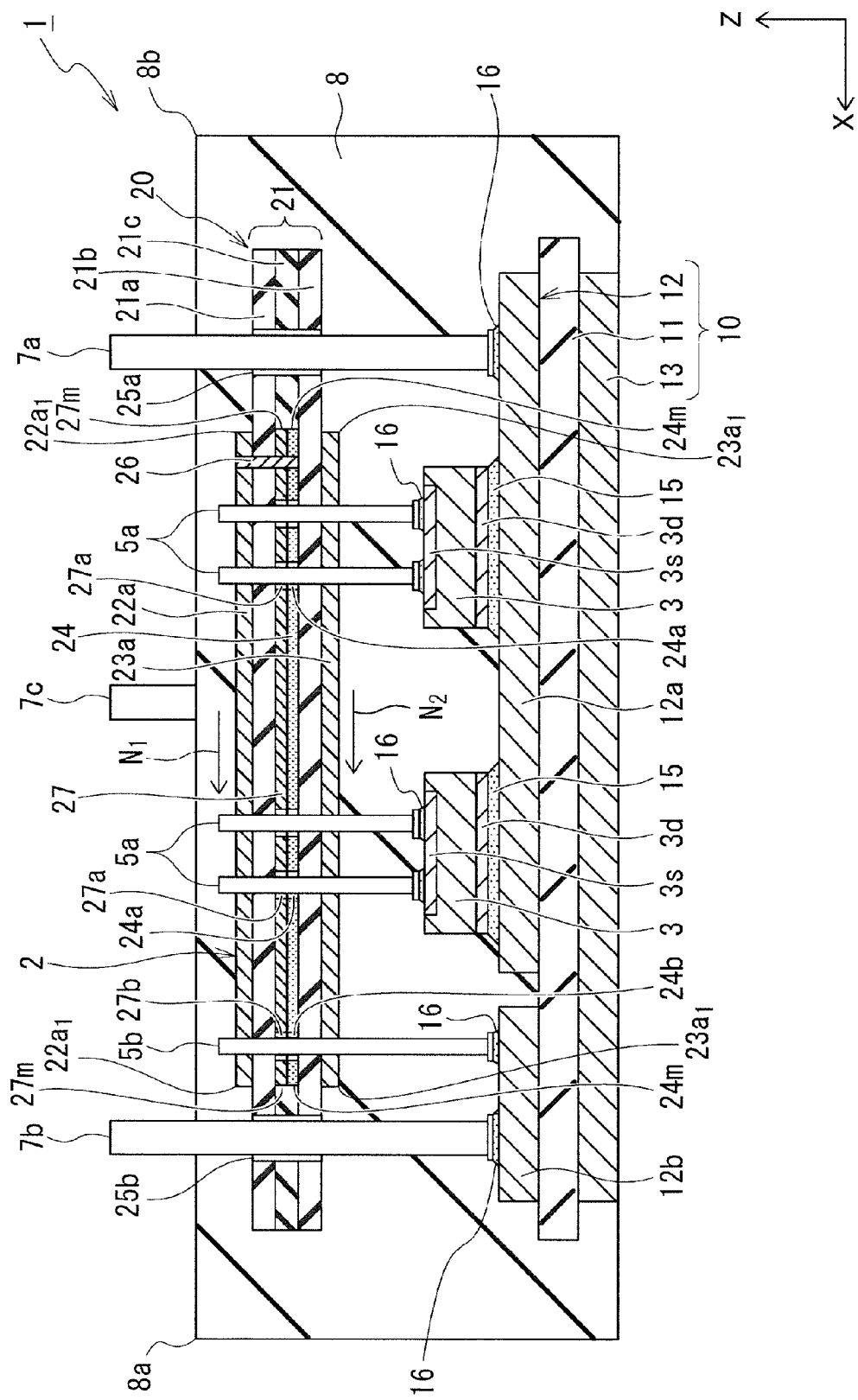
FIG. 2 is a schematic cross-sectional view cut at the position of the II-II cutting line of FIG. 1.
Figure 3:
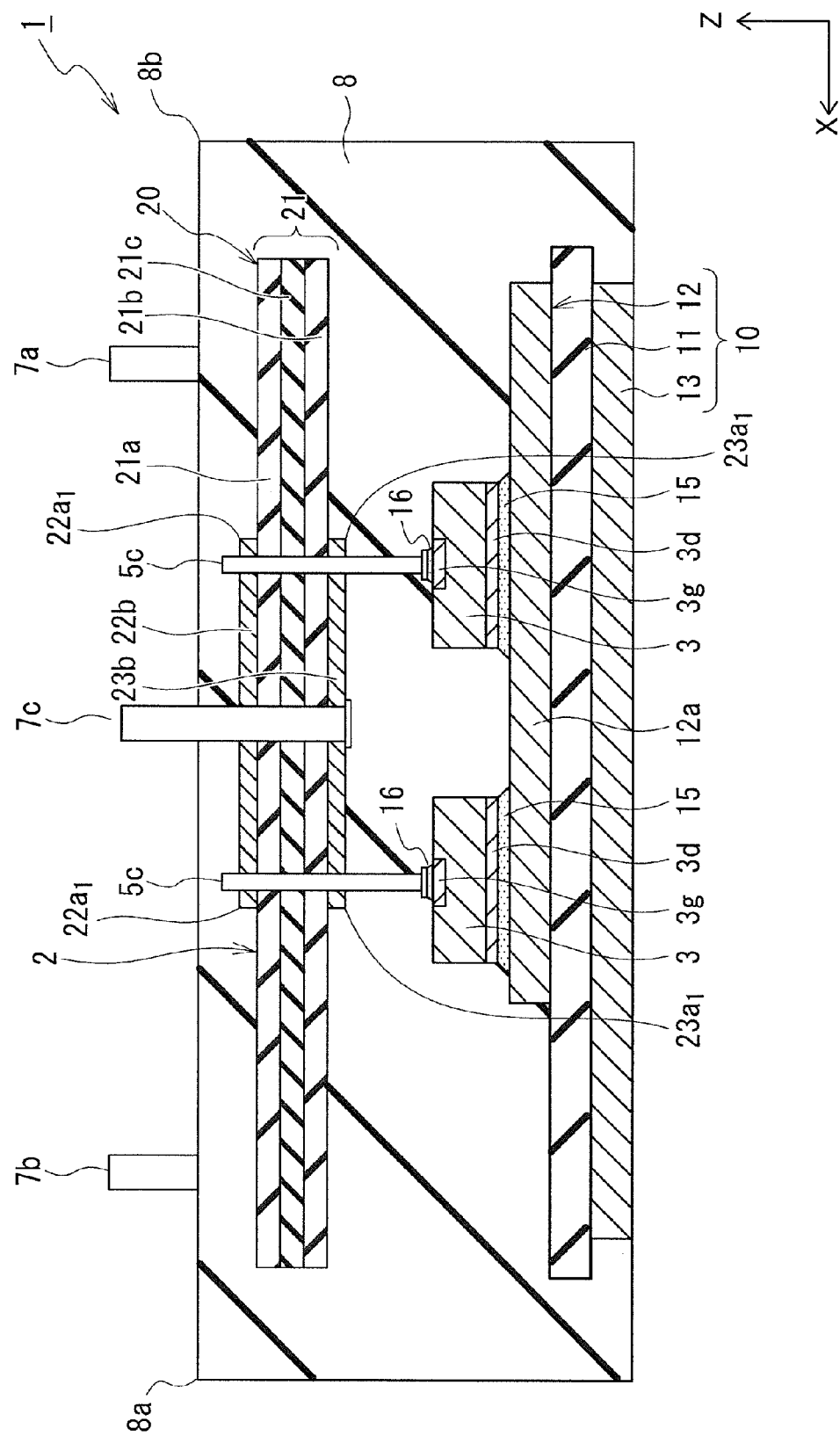
FIG. 3 is a schematic cross-sectional view cut at the position of the III-III cutting line of FIG. 1.

FIG. 1 shows a plan view of a semiconductor device 1 according to an embodiment of the present invention. A cross-sectional structure cut at the position of the II-II cutting line in FIG. 1 is shown in FIG. 2. A cross-sectional structure cut at the position of the III-III cutting line in FIG. 1 is shown in FIG. 3. A cross-sectional structure cut at the position of the IV-IV cutting line in FIG. 1 is shown in FIG. 4.

Figure 4:
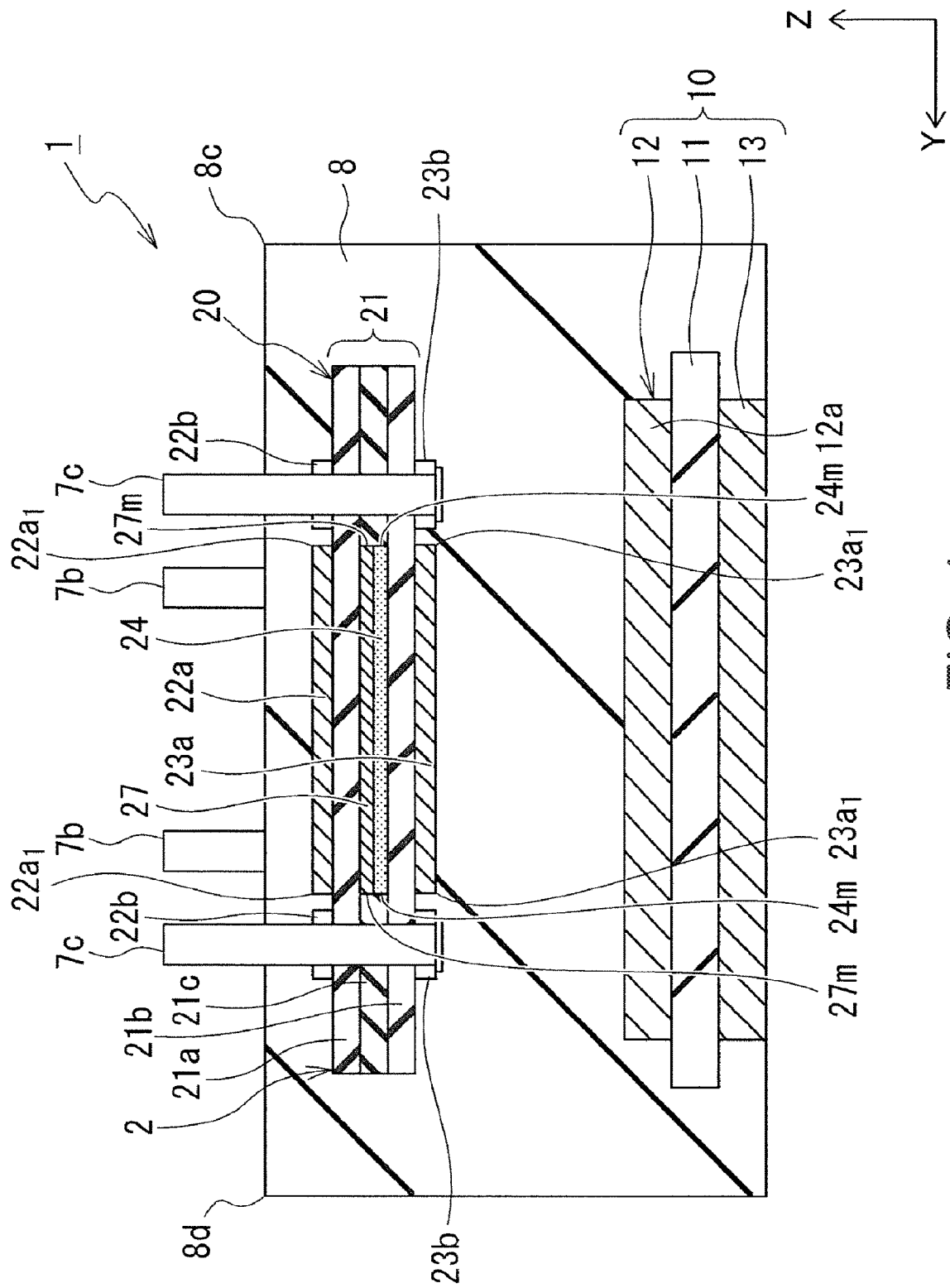
FIG. 4 is a schematic cross-sectional view cut at the position of the IV-IV cutting line of FIG. 1.

As shown in FIGS. 2 to 4, the semiconductor device 1 according to the embodiment of the present invention includes a substrate laminate 2 and a resin sealing body 8 that seals the substrate laminate 2. The substrate laminate 2 includes an insulating circuit board 10, semiconductor chips 3 mounted on the insulating circuit board 10, and a wiring board 20 that is disposed over and separated from the semiconductor chips 3 so as to face the chip mounting surface of the insulating circuit board 10. Further, the substrate laminate 2 includes first conductive posts 5a, second conductive posts 5b, third conductive posts 5c, first main circuit terminals 7a, second main circuit terminals 7b, and control terminals 7c.

The resin sealing body 8 is made of, for example, an epoxy-based thermosetting insulating resin. The resin sealing body 8 is formed by, for example, a transmolding method. As shown in FIG. 1, the resin sealing body 8 has a rectangular shape in a plan view, and has a short side 8a and another short side 8b located opposite to each other in the longitudinal direction which is the X direction (first direction), and has a long side 8c and another long side 8d located opposite to each other in the shorter side direction which is the Y direction (second direction) orthogonal to the X direction. The resin sealing body 8 has a thickness in the Z direction (third direction) orthogonal to the X direction and the Y direction (see FIGS. 2 to 4).

As shown in FIGS. 2 to 4, the insulating circuit board 10 has an insulating plate 11, a conductive plate 12 arranged on one main surface of the insulating plate 11, and a heat radiating plate 13 arranged on the other main surface of the insulating plate 11 that is on a side opposite to one main surface. The conductive plate 12 includes a first conductive plate 12a and a second conductive plate 12b that are insulated and separated from each other.

The insulating circuit board 10 may be, for example, a direct copper bonded (DCB) substrate in which copper is eutectic-bonded to one main surface and the other main surface of a ceramic substrate, or an AMB substrate in which a metal is arranged by the active metal brazing (AMB) method on one main surface and the other main surface of the ceramic substrate. As the material of the insulating plate 11, for example, silicon nitride ($Si_3N_4$), aluminum nitride (AlN), alumina ($Al_2O_3$) and the like can be adopted. For the conductive plate 12 and the heat radiating plate 13, for example, copper (Cu) having excellent electrical conductivity and thermal conductivity is used as the metal material.

Figure 5:
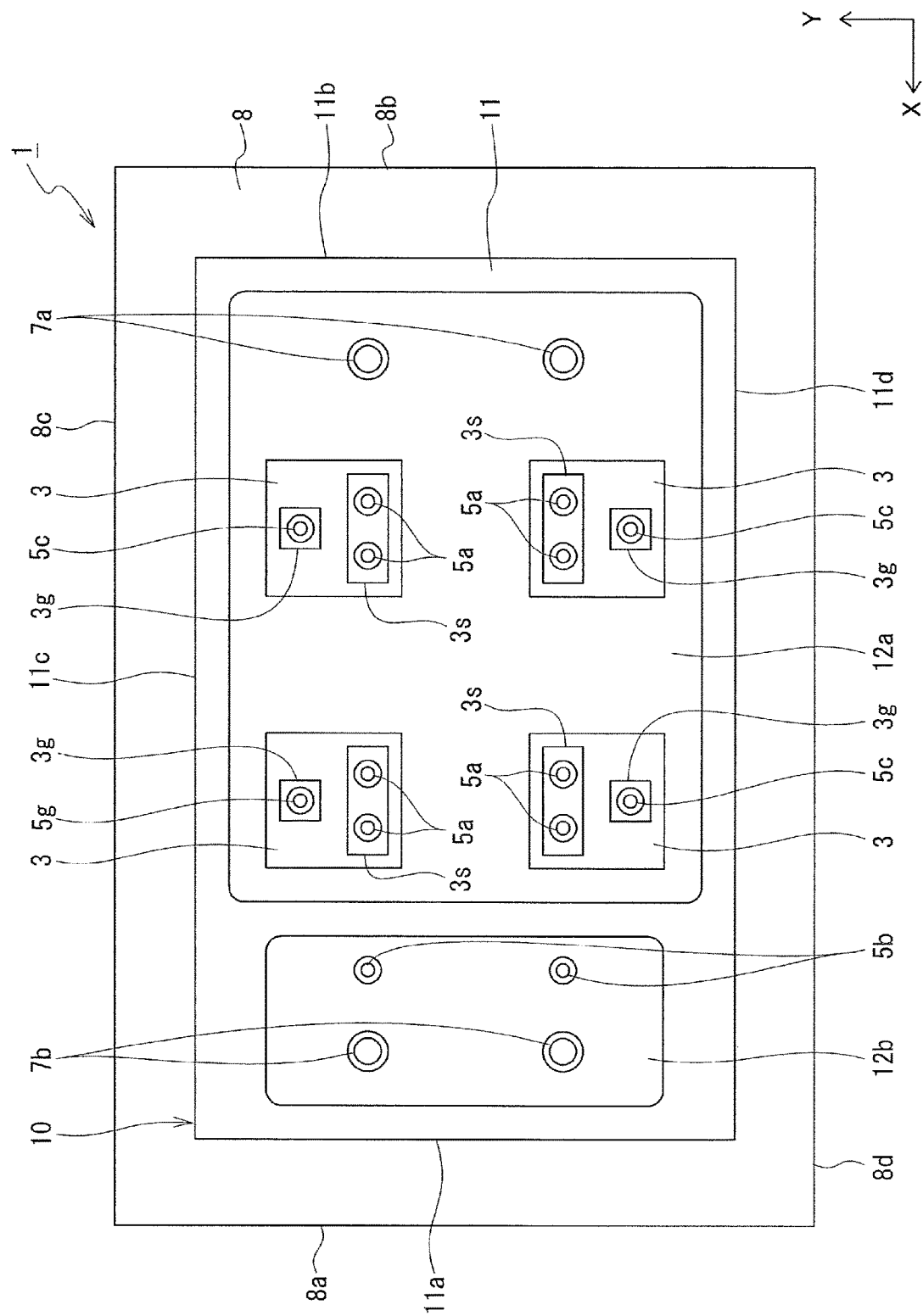
FIG. 5 is a schematic plan view showing an arrangement of semiconductor chips according to the embodiment of this invention.

As shown in FIG. 5, the insulating plate 11 of the insulating circuit board 10 has a rectangular shape in a plan view, for example, having two short sides 11a and 11b opposite to each other in the longitudinal direction that is the X direction, the shot sides 11a 11b being extending in the same direction as the two short sides 8a and 8b of the resin sealing body 8, and having two long sides 11c and 11d opposite to each other in the short side direction that is the Y direction, the long sides 11c and 11d being extending in the same direction as the two long sides 8c and 8d of the resin sealing body 8.

The first conductive plate 12a of the insulating circuit board 10 has, for example, a rectangular consistent pattern in a plan view, and is arranged closer to the short side 11b of the insulating plate 11 so that the longitudinal direction thereof coincides with the X direction. The second conductive plate 12b has, for example, a rectangular consistent pattern in a plan view, and is arranged close to the other short side 11a of the insulating plate 11 so that the longitudinal direction thereof coincides with the Y direction. The first conductive plate 12a has an area several times larger than that of the second conductive plate 12b.

Although not shown in detail, the heat radiating plate 13 has, for example, a rectangular consistent pattern in a plan view, and is arranged on the inner side of the insulating plate 11 in a plan view so that the longitudinal direction thereof coincides with the X direction. In this embodiment, the bottom surface of the heat radiating plate 13 is the bottom main surface of the insulating circuit board 10, and the bottom surface of the heat radiating plate 13 (the other main surface of the insulating circuit board 10) is exposed from the bottom of the resin sealing body 8.

The number of the semiconductor chips 3 is not limited, but for example, four of them are arranged, as shown in FIG. 5. Two of the four semiconductor chips 3 are arranged on one long side 11c side of the insulating plate 11 at predetermined intervals along the long side 11c. The remaining two semiconductor chips 3 are arranged on the other long side 11d side of the insulating plate 11 at predetermined intervals along the long side 11d.

A transistor element is mounted in the semiconductor chip 3. A single switching element is constructed by connecting the respective transistor elements of the four semiconductor chips 3 in parallel. As the transistor element, a vertical semiconductor element having an insulated gate structure such as a MOSFET or an IGBT in which a main current flows in the depth direction of the semiconductor chip 3, for example, is preferable.

In this embodiment, a case where a vertical MOSFET having an insulated gate structure mainly composed of a semiconductor substrate made of silicon carbide (SiC) is used as the transistor element will be described. The semiconductor substrate may be composed of, for example, a silicon (Si) substrate, or may be composed of a wide bandgap semiconductor substrate such as gallium nitride (GaN) or gallium oxide ($Ga_2O_3$).

As shown in FIGS. 2, 3 and 5, for example, the semiconductor chip 3 has a source electrode 3s as a second main electrode and a gate electrode 3g as a control electrode on one of the two main surfaces that are opposite to each other, and has a drain electrode 3d as a first main electrode on the other main surface.

As shown in FIGS. 2 and 3, the drain electrode 3d of the semiconductor chip 3 is bonded to the first conductive plate 12a via a bonding material 15 such as solder, and is electrically and mechanically connected to the first conductive plate 12a. This way, the four semiconductor chips 3 are mounted on one main surface of the insulating circuit board 10 such that the drain electrodes 3d are connected in parallel with each other.

As shown in FIGS. 2 to 4, the wiring board 20 is arranged so as to face one main surface (chip mounting surface) side of the insulating circuit board 10 and to be above and be separated from the semiconductor chips 3. The wiring board 20 is supported by the insulating circuit board 10 via the first conductive posts 5a, the second conductive posts 5b, the third conductive posts 5c, and the semiconductor chip 3.

Figure 6:
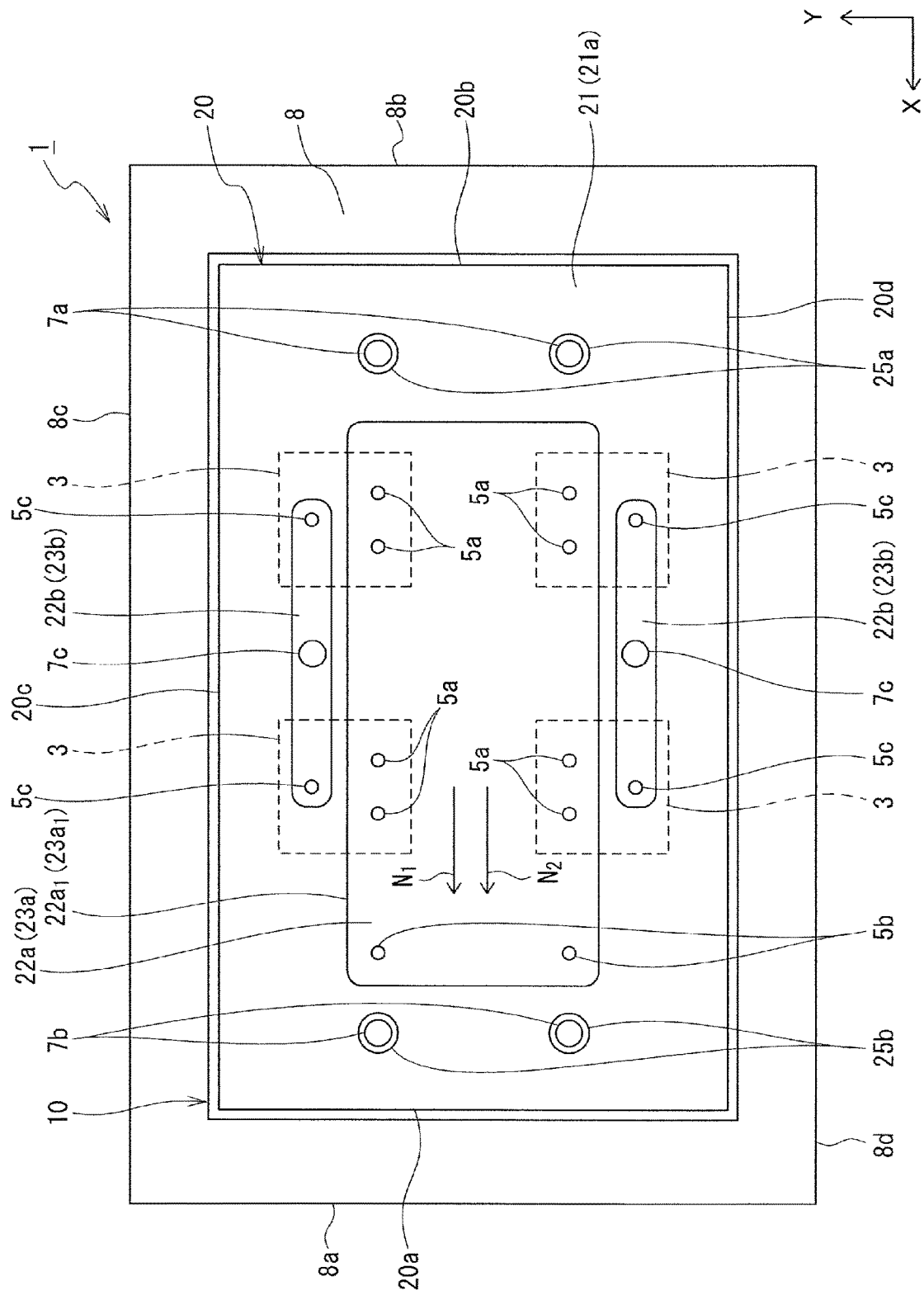
FIG. 6 is a schematic plan view showing a planary pattern of the conductive layer of the wiring board according to the embodiment of this invention.
Figure 7:
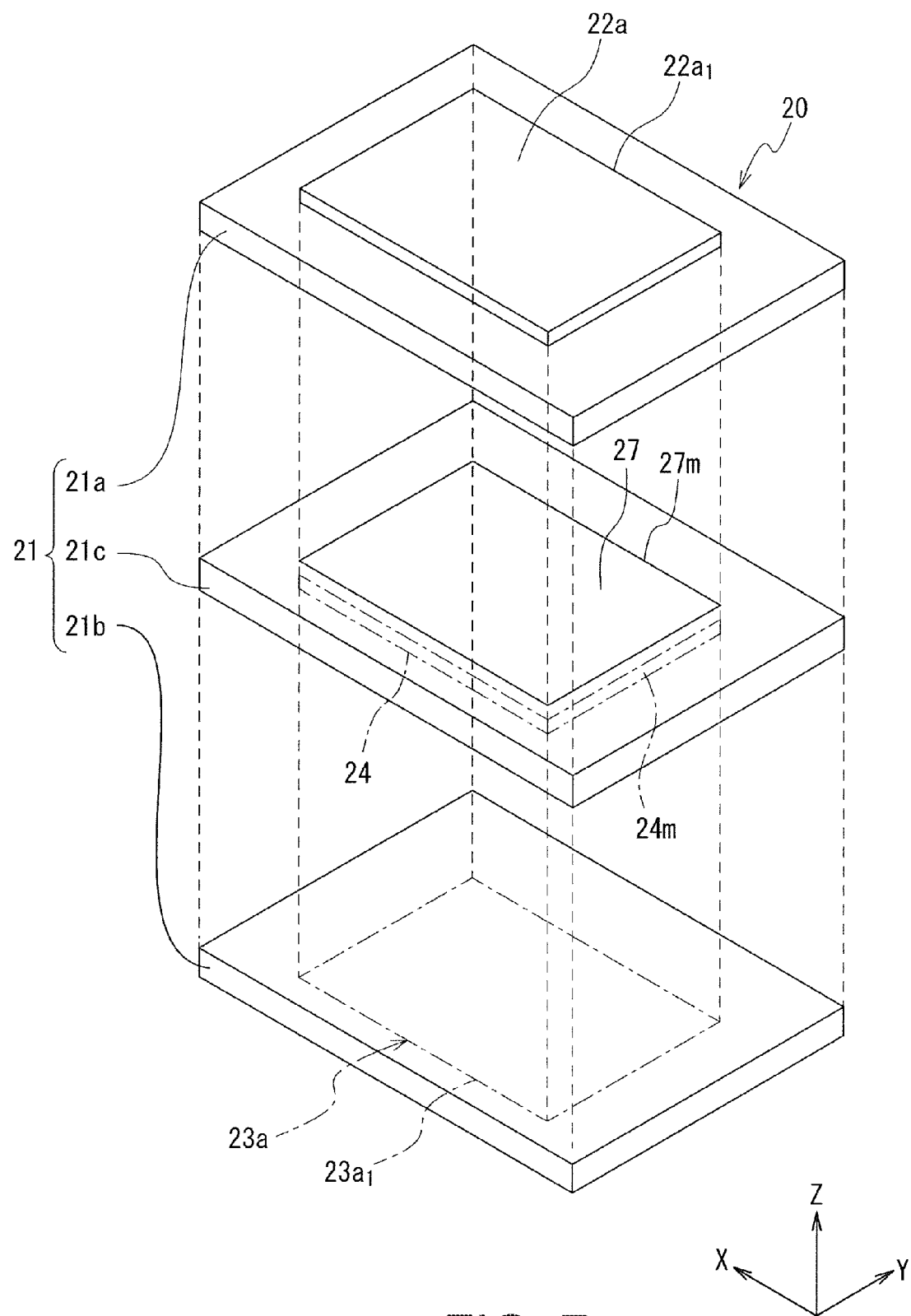
FIG. 7 is a schematic exploded view showing a configuration of a wiring board according to the embodiment of the present invention.

As shown in FIG. 6, the wiring board 20 has, for example, a rectangular shape in a plan view, and is arranged such that two short sides 20a and 20b located on opposite sides in the longitudinal direction that is the X direction extend parallel to the two short sides 8a and 8b of the resin sealing body 8 and the two long sides 20c and 20d located on opposite sides in the widthwise direction that is the Y direction extend parallel to the long sides 8c and 8d of the resin sealing body 8.

As shown in FIGS. 2 to 4, 6, and 7, the wiring board 20 has an insulating plate 21 having one main surface and another main surface located on opposite sides of each other; a first conductive layer 22a and a first gate wiring 22b, which are arranged on the one main surface of the insulating plate 21; and a second conductive layer 23a and a second gate wiring 23b arranged on the other main surface of the insulating plate 21. It should be noted that in FIG. 7, the first gate wiring 22b, the second gate wiring 23b, the openings 24a and 24b of the magnetic layer 24, the openings 27a and 27b of the carbon layer 27, the through holes 25a and 25b, and the like, which are shown in FIG. 6, are omitted.

The wiring board 20 includes a magnetic layer (magnetic sheet) 24 embedded in the insulating plate 21, made of a magnetic material having a higher relative magnetic permeability (maximum) than the first conductive layer 22a and the second conductive layer 23a, and a carbon layer 27 embedded in the insulating plate 21, having a higher thermal conductivity than the first conductive layer 22a and the second conductive layer 23a. In this embodiment, the magnetic layer 24 and the carbon layer 27 are laminated.

The first conductive layer 22a and the first gate wiring 22b are formed by patterning a first conductive layer provided on one main surface of the insulating plate 21 into respective predetermined patterns. The second conductive layer 23a and the second gate wiring 23b are formed by patterning a second conductive layer provided on the other main surface of the insulating plate 21 into respective predetermined patterns. The first conductive layer 22a, the first gate wiring 22b, the second conductive layer 23a, and the second gate wiring 23b each have a thickness of, for example, about 75 m. The first conductive layer 22a, the first gate wiring 22b, the second conductive layer 23a, and the second gate wiring 23b are formed of, for example, copper foil or an alloy foil containing copper as a main component.

The first conductive layer 22a and the first gate wirings 22b are formed in the same pattern as the second conductive layer 23a and the second gate wirings 23b, respectively. Therefore, the plan patterns of the first conductive layer 22a and the first gate wiring 22b will be illustrated and described with reference to FIG. 6, and the illustration and description of the plan patterns of the second conductive layer 23a and the second gate wiring 23b will be omitted.

As shown in FIG. 6, the first conductive layer 22a has a consistent rectangular shape in a plan view, and is arranged in the center of the insulating plate 21 so that the longitudinal direction coincides with the X direction. Two of the first gate wirings 22b are provided, for example. One gate wiring 22b is arranged between one long side 20c of the wiring board 20 and the first conductive layer 22a, and extends in the X direction. The other gate wiring 22b is arranged between the other long side 20d of the wiring board 20 and the first conductive layer 22a, and extends in the X direction. The two gate wirings 22b are separated from the first conductive layer 22a and are electrically insulated and separated.

The second conductive layer 23a and the second gate wirings 23b are formed in the same pattern as the first conductive layer 22a and the first gate wirings 22b, and overlap the first conductive layer 22a and the first gate wirings 22b in a plan view. The two second gate wirings 23b are separated from the second conductive layer 23a and are electrically insulated and separated. The first conductive layer 22a and the second conductive layer 23a are used as current paths through which the main circuit current flows.

As shown in FIGS. 2 to 4, 6, and 7, the insulating plate 21 includes a first insulating layer 21a that is arranged on the first conductive layer 22a side of the magnetic layer 24 and the carbon layer 27 and that has a plan size greater than the magnetic layer 24 and the carbon layer 27; a second insulating layer 21b that is arranged on the second conductive layer 23a side of the magnetic layer 24 and the carbon layer 27 and that has a plan size larger than the magnetic layer 24 and the carbon layer 27; and a third insulating layer 21c that is arranged between the first insulating layer 21a and the second insulating layer 21b so as to surround the magnetic layer 24 and the carbon layer 27. The first insulating layer 21a, the second insulating layer 21b, and the third insulating layer 21c are formed of, for example, a resin sheet made of a polyimide resin having excellent insulating properties and heat resistance. The third insulating layer 21c may alternatively be formed of, for example, an insulating adhesive. The first insulating layer 21a, the second insulating layer 21b, and the third insulating layer 21c are integrated with the magnetic layer 24 and the carbon layer 27 by, for example, thermocompression bonding.

That is, the magnetic layer 24 and the carbon layer 27 are embedded in the insulating plate 21 that includes the first insulating layer 21a, the second insulating layer 21b, and the third insulating layer 21c. One main surface of the magnetic layer 24 on the second conductive layer 23a side is in contact with one main surface of the second insulating layer 21b, and the other main surface of the magnetic layer 24 on the first conductive layer 22a side is in contact with one surface of the carbon layer 27 on the second conductive layer 23a side. The other main surface of the carbon layer 27 on the first conductive layer 22a side is in contact with the other main surface of the first insulating layer 21a.

As shown in FIGS. 2 to 4, 7 and 8, the magnetic layer 24 has a contour 24m that is flush with the contour 22al of the first conductive layer 22a and the contour 23al of the second conductive layer 23a in a plan view or that is located on inner sides of the contour 22al of the first conductive layer 22a and the contour 23al of the second conductive layer 23a. In this embodiment, the contour 24m of the magnetic layer 24 is flush with the contour 22al of the first conductive layer 22a and the contour 23al of the second conductive layer 23a. In other words, the outer peripheral end of the magnetic layer 24 is aligned with the outer peripheral ends of the first conductive layer 22a and the second conductive layer 23a in a plan view.

The relative magnetic permeability of the magnetic layer 24 is preferably about 5 to 500,000, more preferably about 600 to 500,000. Preferable specific materials for the magnetic layer 24 include stainless steel foil, nickel foil, amorphous foil (composition: Fe—Si—B or Co—Fe—Si-BM), and permalloy foil (composition: Fe-50Ni system or Fe-80Ni system), FINEMET (registered trademark) foil (manufactured by Hitachi Metals Co., Ltd., composition: Fe—Cu—Nb—Si—B) and the like. The magnetic layer 24 is more preferably formed of a magnetic material having a higher relative magnetic permeability than a copper foil or an alloy foil containing copper as a main component. As the magnetic layer 24, for example, a sheet-like member may be used. Alternatively, the magnetic layer 24 may be formed by plating, sputtering, vapor deposition, or the like.

The thickness of the magnetic layer 24 is preferably 1 µm or more and 50 µm or less, and more preferably 10 µm or more and 50 µm or less. By setting the thickness of the magnetic layer 24 to 50 µm or less, it is possible to prevent heat generation of the magnetic layer 24 itself that would occur due to the flow of eddy currents in the magnetic layer 24. Further, by setting the thickness of the magnetic layer to 10 µm or more, it is possible to prevent magnetic saturation of the magnetic layer 24 when a large current flows through the first conductive layer 22a and the second conductive layer 23a. Here, even if the thickness of the magnetic layer 24 is reduced, a sufficient withstand voltage between the first conductive layer 22a and the second conductive layer 23a can be secured by adjusting the thicknesses of the first insulating layer 21a and the second insulating layer 21b.

As shown in FIGS. 2 to 4, 7 and 9, the carbon layer 27 has a contour 27m in a plan view that is flush with the contour 22al of the first conductive layer 22a and the contour 23al of the second conductive layer 23a or that is located on inner sides of the contour 22al of the 1 conductive layer 22a and the contour 23al of the second conductive layer 23a. In this embodiment, the contour 27m of the carbon layer 27 coincides with the contour 24m of the magnetic layer 24, and is flush with the contour 22al of the first conductive layer 22a and the contour 23al of the second conductive layer 23a. In other words, the outer peripheral end of the carbon layer 27 is aligned with the outer peripheral ends of the first conductive layer 22a and the second conductive layer 23a in a plan view.

The contour 27m of the carbon layer 27 may not need to coincide with the contour 24m of the magnetic layer 24, and the contour 27m of the carbon layer 27 may be located inside or outside the contour 24m of the magnetic layer 24. The thickness of the carbon layer 27 may be the same as the thickness of the magnetic layer 24, may be thicker than the magnetic layer 24, or may be thinner than the magnetic layer 24.

The thermal conductivity of the carbon layer 27 in at least planary directions (X direction and Y direction) is higher than the thermal conductivity of the first conductive layer 22a and the second conductive layer 23a (which is, for example, about 400 W/mK, which is the thermal conductivity of copper). As the carbon layer 27, for example, a layer containing carbon such as sheet-shaped graphite (graphite sheet) or graphene (graphene sheet) can be used. The carbon layer 27 may be made of carbon fibers or a composite material using carbon fibers. Examples of the composite material using carbon fiber include carbon fiber reinforced plastic (CFRP) and carbon fiber reinforced carbon composite material. For example, the sheet-shaped carbon layer 27 may be adhered to the magnetic layer 24 with an adhesive.

Graphene is a single-atomic layer sheet-like substance to which carbon atoms are bonded, and graphite has a laminated structure of a plurality of graphene sheets. Graphite and graphene have anisotropy in thermal conductivity. When graphite or graphene is used for the carbon layer 27 and the thermal conductivity in the planary directions (X direction and Y direction) (for example, about 1500 W/mK) is higher than the thermal conductivity in the thickness direction (Z direction) (for example, about 5 W/mK), heat can be instantly diffused in the planary directions of the carbon layer 27.

Here, if the magnetic layer 24 and the carbon layer 27 are electrically floated, a floating capacitance would be added. Therefore, it is preferable that the magnetic layer 24 and the carbon layer 27 have the same potential as the first conductive layer 22a and the second conductive layer 23a. In this embodiment, as shown in FIG. 2, the magnetic layer 24 and the carbon layer 27 are electrically connected to the first conductive layer 22a via the through-hole wiring 26, and thereby assume the same potential as the first conductive layer 22a and the second conductive layer 23a.

As shown in FIG. 2, one end of the first conductive post 5a is electrically and mechanically connected to the source electrode 3s of the semiconductor chip 3 by a bonding material 16 such as solder, and the other end thereof penetrates the wiring board 20 so as to be fixed to the wiring board 20 and electrically and mechanically connected to the first conductive layer 22a and the second conductive layer 23a. That is, one end of the first conductive post 5a is fixed to the insulating circuit board 10 via the semiconductor chip 3, and the other end of the first conductive post 5a is fixed to the wiring board 20. The number of the first conductive posts 5a is not limited to this number; for example, two first conductive posts 5a are provided for each semiconductor chip 3.

As shown in FIG. 2, one end of the second conductive post 5b is electrically and mechanically connected to the second conductive plate 12b of the insulating circuit board 10 by a bonding material 16 such as solder, and the other end thereof penetrates the wiring board 20 so as to be fixed to the wiring board 20 and electrically and mechanically connected to the first conductive layer 22a and the second conductive layer 23a. That is, one end of the second conductive post 5b is fixed to the insulating circuit board 10, and the other end of the second conductive post 5b is fixed to the wiring board 20. The number of the second conductive posts 5b is not limited to this number; for example, two of them are provided.

As shown in FIG. 3, one end of the third conductive post 5c is electrically and mechanically connected to the gate electrode 3g of the semiconductor chip 3 by a bonding material 16 such as solder, and the other end thereof penetrates the wiring board 20 so as to be fixed and electrically and mechanically connected to the first gate wiring 22b and the second gate wiring 23b. That is, one end of the third conductive post 5c is fixed to the insulating circuit board 10 via the semiconductor chip 3, and the other end of the third conductive post 5c is fixed to the wiring board 20. The number of the third conductive posts 5c is not limited to this number; for example, one third conductive post 5c is provided for each semiconductor chip 3.

As shown in FIGS. 1 to 4, the first main circuit terminals 7a, the second main circuit terminals 7b, and the control terminals 7c are sealed with the resin sealing body 8 except for their respective top parts, and their top parts are exposed from the resin sealing body 8. That is, each of the first main circuit terminals 7a, the second main circuit terminals 7b, and the control terminals 7c extends from the inside of the resin sealing body 8 towards an exterior in the thickness direction (Z direction) of the resin sealing body 8. Each of the first main circuit terminals 7a, the second main circuit terminals 7b, and the control terminals 7c is constructed of a conductive pin.

As shown in FIG. 2, one end of the first main circuit terminal 7a is electrically and mechanically connected to the first conductive plate 12a of the insulating circuit board 10 by a bonding material 16 such as solder, its intermediate portion penetrates through the through hole 25a of the wiring board 20, and the other end protrudes from one main surface of the resin sealing body 8. One end of the second main circuit terminal 7b is electrically and mechanically connected to the second conductive plate 12b of the insulating circuit board 10 by a bonding material 16 such as solder, its intermediate portion penetrates the through hole 25b of the wiring board 20, and the other end protrudes from one main surface of the resin sealing body 8.

That is, the first main circuit terminal 7a is electrically connected to the drain electrode 3d of the semiconductor chip 3 via the bonding material 16, the first conductive plate 12a of the insulating circuit board 10, and via the bonding material 15. The source electrode 3s of the semiconductor chip 3 is electrically connected to the second main circuit terminal 7b via the bonding material 16, the first conductive post 5a, the first conductive layer 22a and the second conductive layer 23a of the wiring board 20, the second conductive post 5b, the bonding material 16, and via the second conductive plate 12b and the bonding material 16 of the insulating circuit board 10. In each of the four semiconductor chips 3, the source electrodes 3s are connected in parallel to each other via the first conductive layer 22a and the second conductive layer 23a of the wiring board 20. The number of the first main circuit terminals 7a and the second main circuit terminals 7b is not limited to this number; for example, two of them are respectively provided.

As shown in FIG. 3, one end of the control terminal 7c penetrates the wiring board 20 from one main surface side of the wiring board 20, and the other end thereof protrudes from one main surface of the resin sealing body 8. That is, the control terminal 7c is electrically connected to the gate electrode 3g of the semiconductor chip 3 via the first gate wiring 22b and the second gate wiring 23b of the wiring board 20, the third conductive post 5c, and the bonding material 16. Although the number of control terminals 7c is not limited to this number, for example, two control terminals 7c are provided corresponding to the number of first gate wirings 22b and the second gate wirings 23b. The gate electrodes 3g of the four semiconductor chips 3 are connected in parallel to each other via the first gate wiring 22b and the second gate wiring 23b of the wiring board 20.

Figure 8:
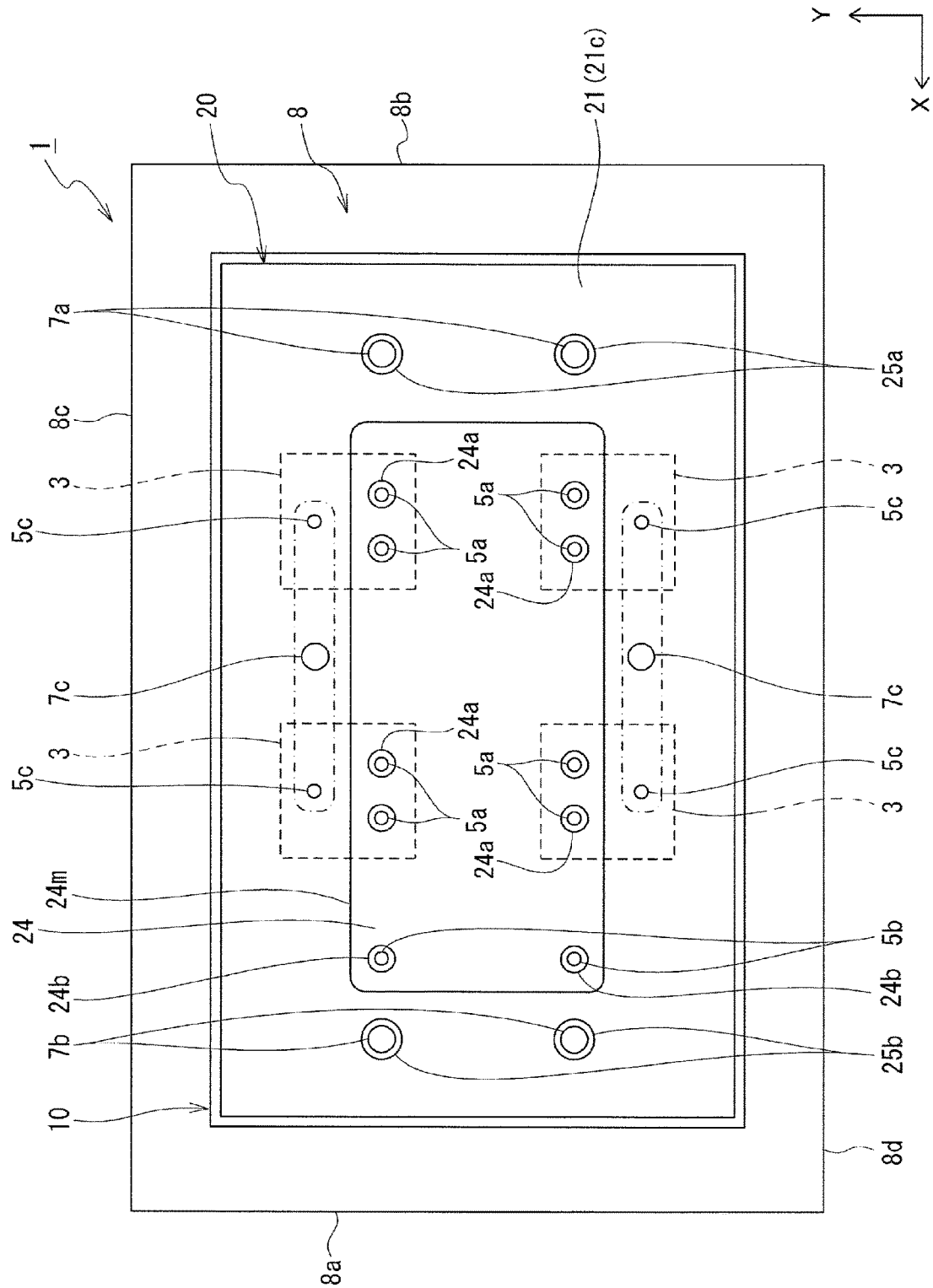
FIG. 8 is a schematic plan view showing a planary pattern of a magnetic layer of the wiring board according to the embodiment of the present invention.

As shown in FIGS. 2 and 8, the magnetic layer 24 has an opening 24a larger than the diameter of the first conductive post 5a in a portion through which the first conductive post 5a passes in order to avoid contact with the first conductive post 5a, and the side wall of the opening 24a of the magnetic layer 24 is separated from the first conductive post 5a. Also, the magnetic layer 24 has an opening 24b larger than the diameter of the second conductive post 5b in a portion through which the second conductive post 5b passes in order to avoid contact with the second conductive post 5b, and the side wall of the opening 24b of the magnetic layer 24 is separated from the second conductive post 5b.

Figure 9:
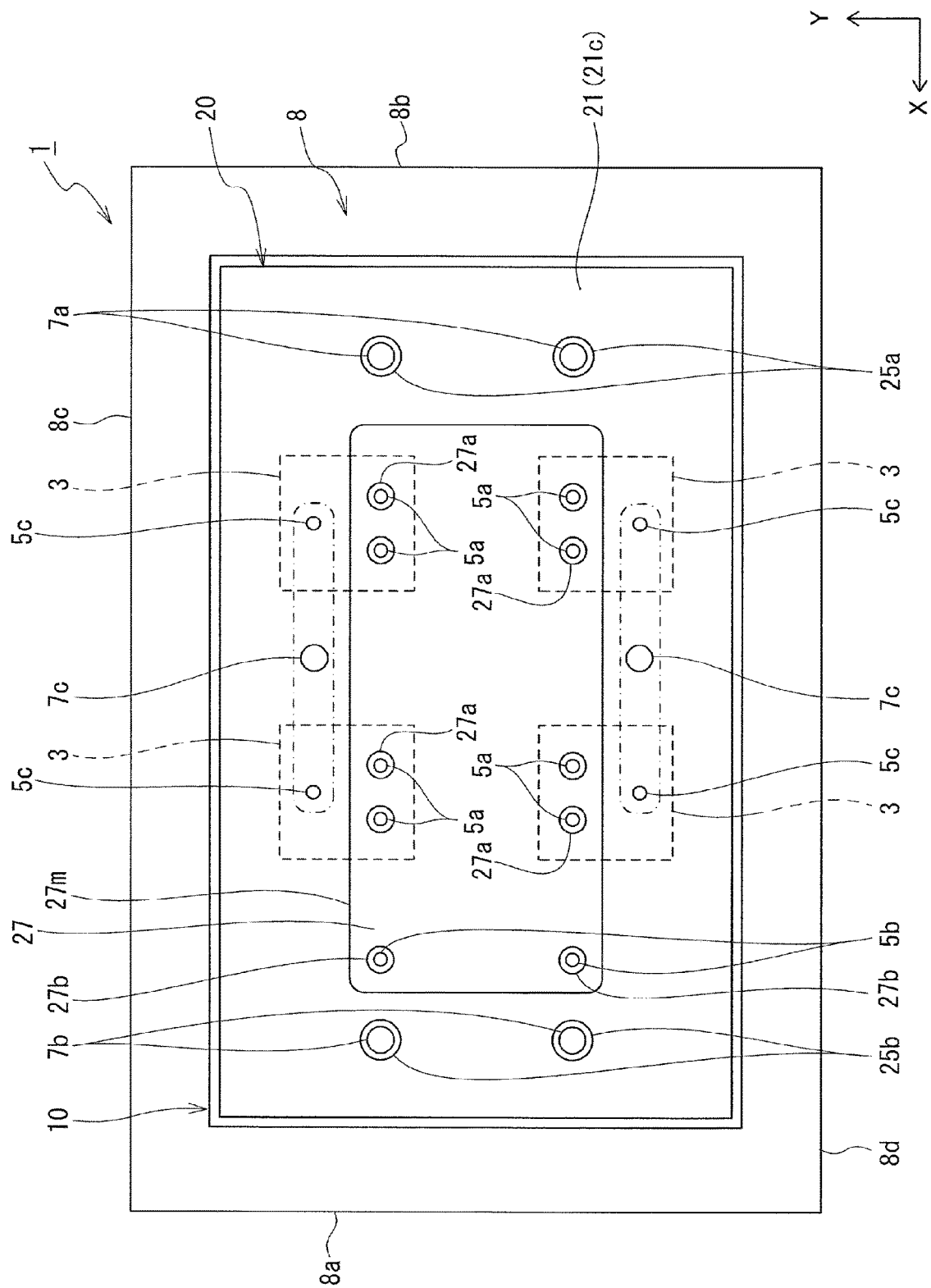
FIG. 9 is a schematic plan view showing a planary pattern of a carbon layer of the wiring board according to the embodiment of the present invention.

As shown in FIGS. 2 and 9, in order to avoid contact with the first conductive post 5a, the carbon layer 27 has an opening 27a larger than the diameter of the first conductive post 5a in a portion through which the first conductive post 5a passes, and the side wall of the opening 27a of the carbon layer 27 is separated from the first conductive post 5a. Also, the carbon layer 27 has an opening 27b larger than the diameter of the second conductive post 5b at a portion through which the second conductive post 5b passes in order to avoid contact with the second conductive post 5b, and the side wall of the opening 27b of the carbon layer 27 is separated from the second conductive post 5b.

<Main Circuit Current of Semiconductor Device>

Next, the flow of the main circuit current of the semiconductor device 1 in this embodiment of the present invention will be described with reference to FIGS. 2, 3 and 6. By applying a control voltage from the control terminal 7c to the gate electrodes 3g of each of the four semiconductor chips 3 via the first gate wiring 22b and the second gate wiring 23b of the wiring board 20, each of the transistor elements of the four semiconductor chips 3 becomes the current flowing state.

The main circuit current flows from the first main circuit terminal 7a through the first conductive plate 12a of the insulating circuit board 10, and flows vertically from the drain electrode 3d to the source electrode 3s of each of the four semiconductor chips 3. Further, the main circuit current flows from the source electrodes 3s of the four semiconductor chips 3 to the first conductive layer 22a and the second conductive layer 23a of the wiring board 20 via the first conductive post 5a. Further, the main circuit current flows through the second conductive post 5b and the second conductive plate 12b of the insulating circuit board 10 to the second main circuit terminal 7b.

Here, in the wiring board 20, since the main circuit current flows through both the first conductive layer 22a and the second conductive layer 23a, it is possible to increase the magnitude of the main circuit current. Further, the main circuit current flows in the direction of arrow N1 in the first conductive layer 22a and in the direction of arrow N2 in the second conductive layer 23a. That is, the main circuit current flows in both the first conductive layer 22a and the second conductive layer 23a in the same direction (arrows N1 and N2).

Effect of Embodiment

In the semiconductor device 1 of the embodiment of the present invention, when the main circuit current is a high frequency current (pulse current), a magnetic field is generated from both the first conductive layer 22a and the second conductive layer 23a, and an eddy current is generated in the direction that suppresses this magnetic field. The eddy current is in the opposite direction to the current flowing through the central portions of the first conductive layer 22a and the second conductive layer 23a, and the eddy current cancels the current flowing through the central portions of the first conductive layer 22a and the second conductive layer 23a. As a result, a skin effect in which the current flows only near the surfaces of the first conductive layer 22a and the second conductive layer 23a occurs. Further, since the currents flowing through the first conductive layer 22a and the second conductive layer 23a are in the same direction, they are repelled by the magnetic fields generated in the first conductive layer 22a and the second conductive layer 23a, and the currents flow at the respective outer sides that are not facing each other, thereby generating the proximity effect.

Figure 10:
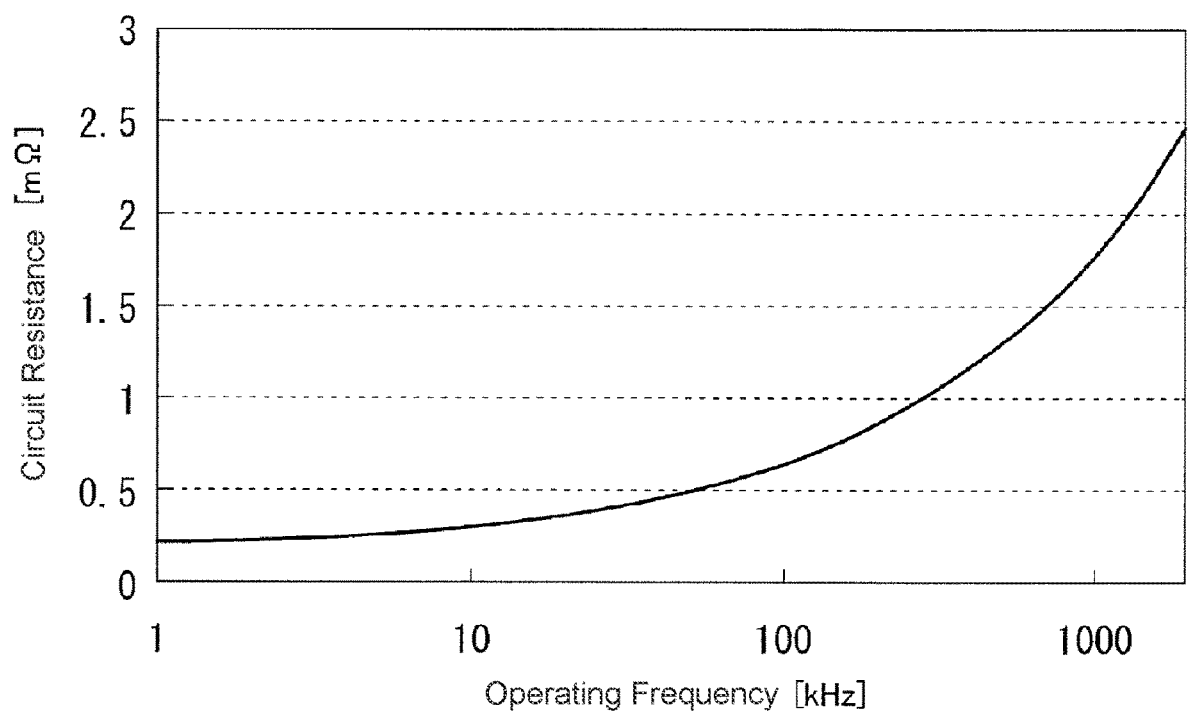
FIG. 10 is a graph showing the relationship between a high-frequency current applied to a conductive layer of a wiring board of a conventional semiconductor device and a circuit resistance.

Here, if the wiring board were a normal printed circuit board in which a single-layer insulating layer is sandwiched between the first conductive layer and the second conductive layer as in a conventional semiconductor device, there is a concern that due to the skin effect and the proximity effect, as shown in FIG. 10, the circuit resistance of the first conductive layer and the second conductive layer would increase and the Joule heat in the first conductive layer and the second conductive layer would increase.

In contrast, in the semiconductor device 1 of the embodiment of the present invention, the magnetic layer 24 made of a magnetic material having a higher relative magnetic permeability than the first conductive layer 22a and the second conductive layer 23a is provided between the first conductive layer 22a and the second conductive layer 23a of the wiring board 20. As a result, the magnetic fields generated from both the first conductive layer 22a and the second conductive layer 23a are taken into the magnetic layer 24, so that the skin effect and the proximity effect can be suppressed. As a result, the circuit resistance of the first conductive layer 22a and the second conductive layer 23a in the high frequency range is reduced, and Joule heat generation in the first conductive layer 22a and the second conductive layer 23a of the wiring board 20 can be suppressed. Therefore, the temperature rise of the first conductive layer 22a and the second conductive layer 23a can be suppressed. As a result, the size of the wiring board 20 can be reduced, and the size of the semiconductor device 1 can be reduced.

Further, by providing a carbon layer 27 having a higher thermal conductivity than the first conductive layer 22a and the second conductive layer 23a between the first conductive layer 22a and the second conductive layer 23a of the wiring board 20, the heat generated in the wiring board 20 can be diffused through the carbon layer 27, thereby improving the heat dissipation (heat diffusibility) of the wiring board 20. Therefore, it is possible to further suppress the temperature rise of the first conductive layer 22a and the second conductive layer 23a.

Further, the carbon layer 27 takes in the magnetic fields generated in the first conductive layer 22a and the second conductive layer 23a, and the proximity effect and the skin effect can therefore be further suppressed. As a result, the circuit resistance of the first conductive layer 22a and the second conductive layer 23a in the high frequency range can be further reduced, and Joule heat generation in the first conductive layer 22a and the second conductive layer 23a of the wiring board 20 can be further suppressed. Therefore, it becomes possible to further suppress the temperature rise of the first conductive layer 22a and the second conductive layer 23a.

Further, if each of the contour 24m of the magnetic layer 24 and the contour 27m of the carbon layer 27 in the plan view were located outside the contour 22al of the first conductive layer 22a and the contour 23al of the second conductive layer 23a, the portions of the magnetic layer 24 and the carbon layer 27 that protrude outside the first conductive layer 22a and the second conductive layer 23a would generate Joule heat due to the eddy current. In contrast, in the wiring board 20 of the present embodiment, the contour 24m of the magnetic layer 24 and the contour 27m of the carbon layer 27 are flush with the contours 22al of the first conductive layer 22a and the contours 23al of the second conductive layer 23a, respectively, in a plan view, or are located inside the contour 22al of the first conductive layer 22a and the contour 23al of the second conductive layer 23a. Because of this, Joule heat generation of the magnetic layer 24 and the carbon layer 27 due to eddy current can be suppressed.

Figure 11:
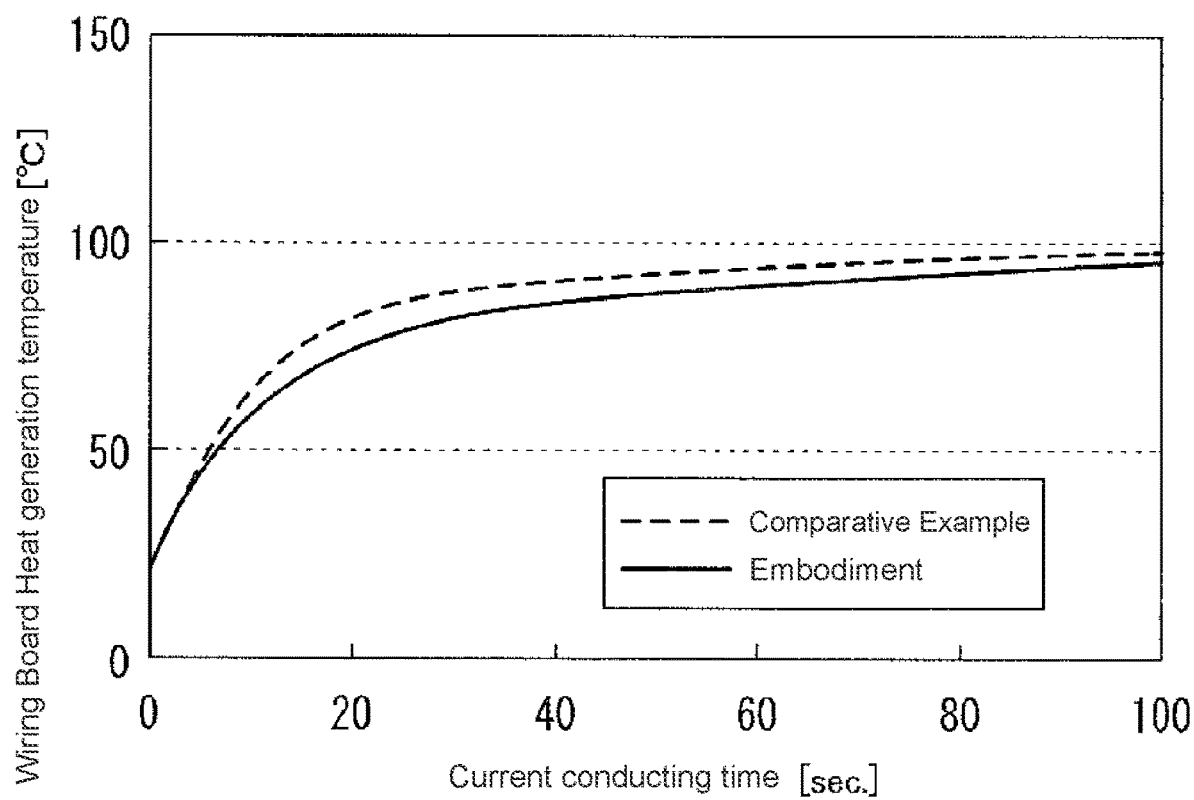
FIG. 11 is a graph showing an evaluation result of a heat generation temperature of the wiring board of the semiconductor device according to the embodiment of the present invention and that of a comparative example.

FIG. 11 shows the results of measuring the heat generation temperature for the semiconductor device 1 of the present embodiment and for a comparative example in which the wiring board is a normal printed circuit board in which a single-layer insulating layer is sandwiched between the first conductive layer and the second conductive layer. As shown in FIG. 11, the heat generation temperature on the wiring board is clearly lower in the embodiment than in the comparative example. Therefore, for the semiconductor device 1 of the embodiment, it was confirmed that the Joule heat generation in the first conductive layer 22a and the second conductive layer 23a can be suppressed.

(First Modification)

Figure 12:
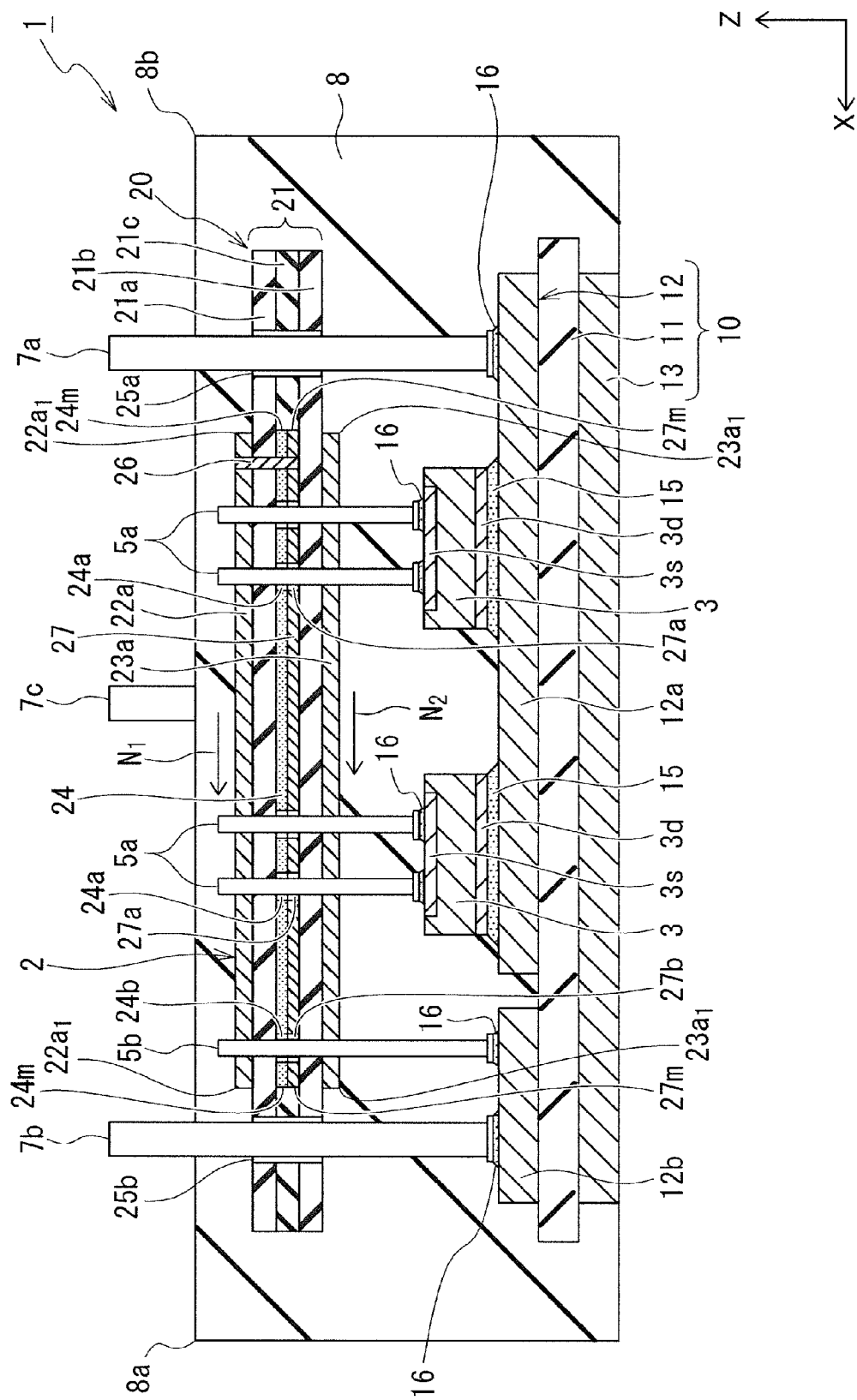
FIG. 12 is a schematic cross-sectional view showing a semiconductor device according to a first modification of the embodiment of the present invention.

A semiconductor device 1 according to a first modification of the embodiment of the present invention differs from the semiconductor device 1 of the above-described embodiment shown in FIG. 2 in that the positions of the magnetic layer 24 and the carbon layer 27 are reversed, as shown in FIG. 12. One main surface of the magnetic layer 24 is in contact with one main surface of the carbon layer 27, and the other main surface of the magnetic layer 24 is in contact with one main surface of the first insulating layer 21a. The other main surface of the carbon layer 27 is in contact with one main surface of the second insulating layer 21b. Since the other configuration of the semiconductor device 1 of the first modification is the same as that of the semiconductor device 1 of the above-mentioned embodiment of the present invention, duplicate description will be omitted.

According to the semiconductor device 1 of the first modification, although the positions of the magnetic layer 24 and the carbon layer 27 are reversed, the same effect as that of the semiconductor device 1 of the above-mentioned embodiment of the present invention can be obtained.

(Second Modification)

Figure 13:
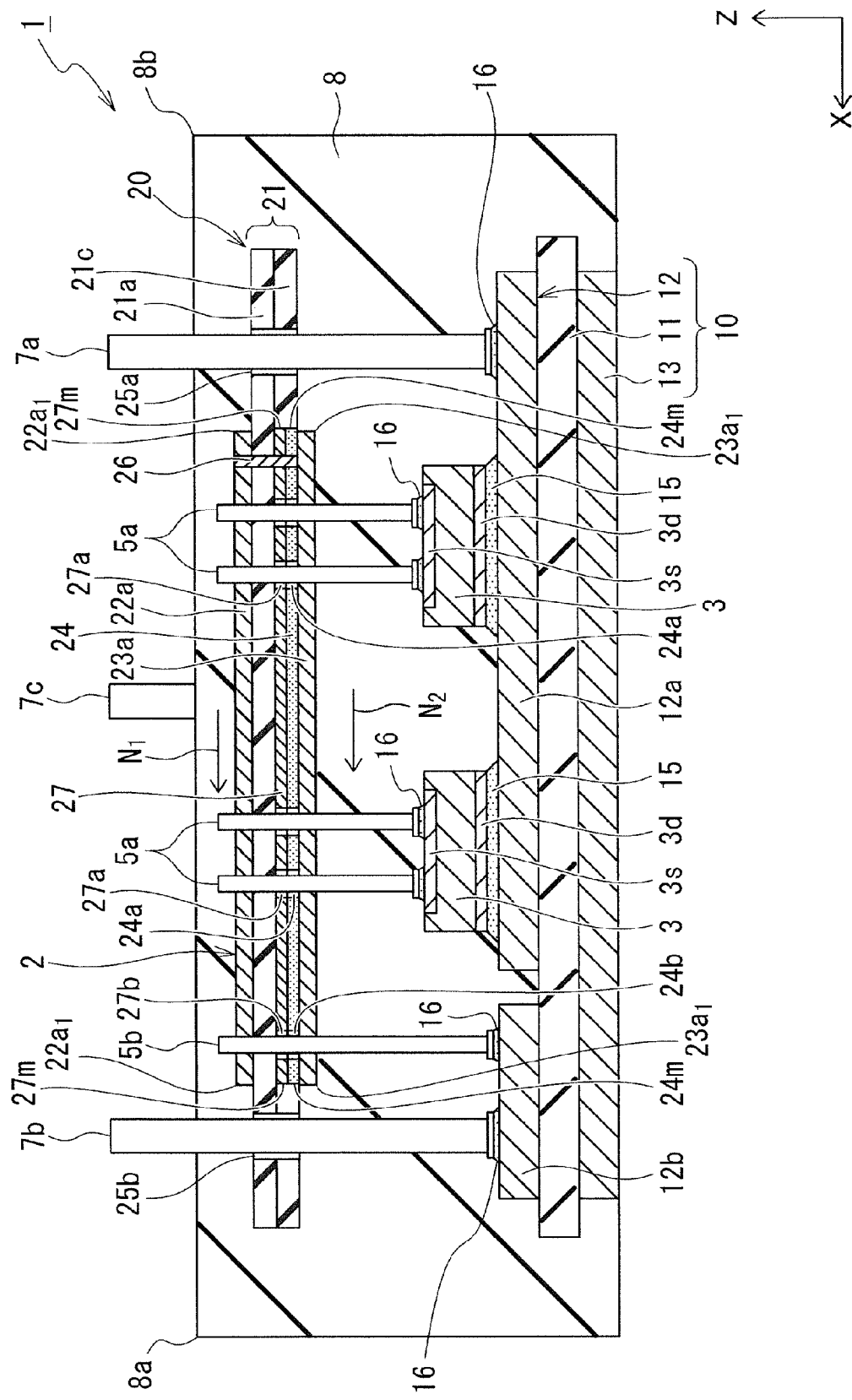
FIG. 13 is a schematic cross-sectional view showing a semiconductor device according to a second modification of the embodiment of the present invention.

A semiconductor device 1 according to a second modification of the above-described embodiment of the present invention differs from the semiconductor device 1 of the above-described embodiment shown in FIG. 2 in that it does not have the second insulating layer 21b, as shown in FIG. 13. The other main surface of the magnetic layer 24 is in contact with the second conductive layer 23a. Since the first insulating layer 21a is arranged between the first conductive layer 22a and the second conductive layer 23a, the insulation between the first conductive layer 22a and the second conductive layer 23a is maintained. Since the other configuration of the semiconductor device 1 of the second modification is the same as that of the semiconductor device 1 of the above-described embodiment of the present invention, duplicate description will be omitted.

Figure 14:
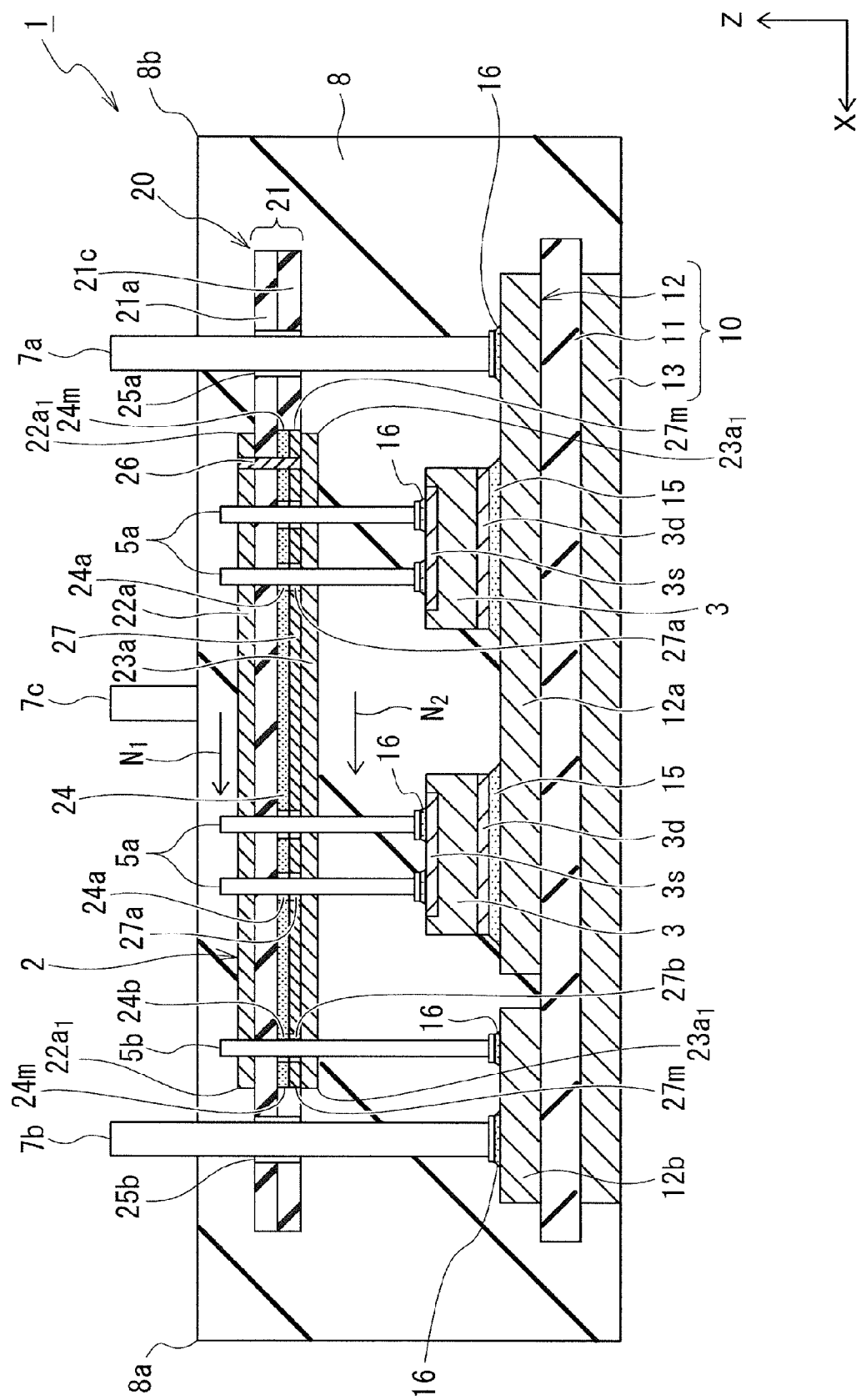
FIG. 14 is a schematic cross-sectional view showing a semiconductor device according to a third modification of the embodiment of the present invention.

According to the semiconductor device of the second modification, although the second insulating layer 21b is absent and the magnetic layer 24 is in contact with the second conductive layer 23a, the same effect as that of the semiconductor device 1 of the above-mentioned embodiment of the present invention is obtained. Here, in the alternative, the first insulating layer 21a may be removed instead, and one main surface of the carbon layer 27 may be in contact with the first conductive layer 22a. Even with that structure, the same effect can be obtained Third Modification Example A semiconductor device 1 according to a third modification of the above-described embodiment of the present invention differs from the semiconductor device 1 of the above-described embodiment of the present invention shown in FIG. 2 in that it does not have the second insulating layer 21b, and the positions of the magnetic layer 24 and the carbon layer 27 are reversed, as shown in FIG. 14. One main surface of the magnetic layer 24 is in contact with one main surface of the carbon layer 27, and the other main surface of the magnetic layer 24 is in contact with one main surface of the the first insulating layer 21a. The other main surface of the carbon layer 27 is in contact with the second conductive layer 23a. Since the other configuration of the semiconductor device 1 of the third modification is the same as that of the semiconductor device 1 of the above-described embodiment of the present invention, duplicate description will be omitted.

According to the semiconductor device 1 according to the third modification, although the second insulating layer 21b is absent and the magnetic layer 24 and the carbon layer 27 are reversed in position, the same effect as the semiconductor device 1 of the above-mentioned embodiment can be obtained. Here, in the alternative, the first insulating layer 21a may be removed instead, and the magnetic layer 24 and the carbon layer 27 may be reversed in position as compared with the above-mentioned embodiment shown in FIG. 2 so that the other main surface of the magnetic layer 24 may be in contact with the first conductive layer 22a. Even with that structure, the same effect can be obtained.

(Fourth Modification)

Figure 15:
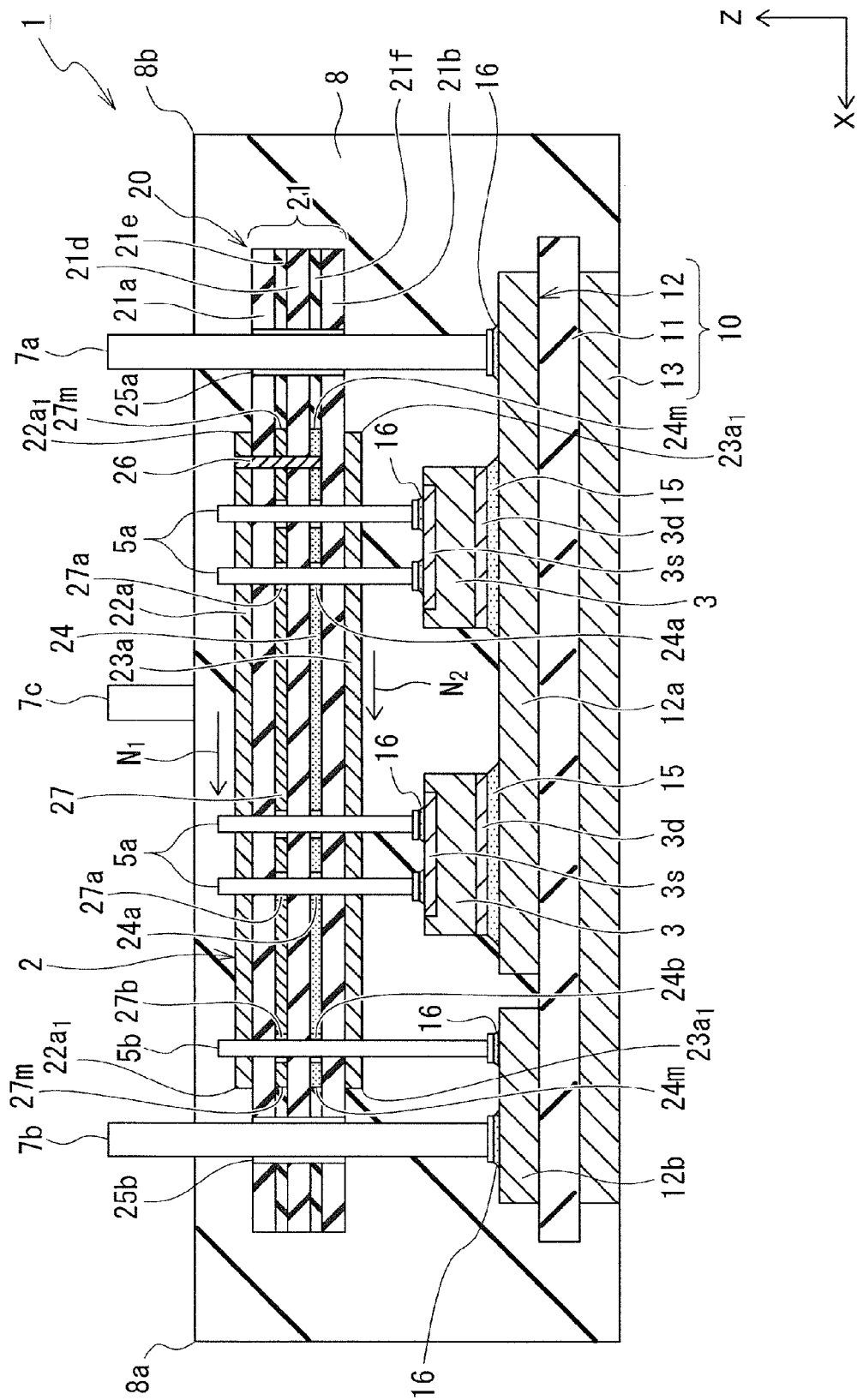
FIG. 15 is a schematic cross-sectional view showing a semiconductor device according to a fourth modification of the embodiment of the present invention.

A semiconductor device 1 according to a fourth modification of the above-mentioned embodiment of the present invention differs from the semiconductor device 1 of the above-mentioned embodiment of the present invention shown in FIG. 2 in that, as shown in FIG. 15, a third insulating layer 21d is arranged between the magnetic layer 24 and the carbon layer 27. Further, a fourth insulating layer 21e is arranged around the carbon layer 27, and a fifth insulating layer 21f is arranged around the magnetic layer 24. The third insulating layer 21d, the fourth insulating layer 21e, and the fifth insulating layer 21f are formed of, for example, a resin sheet made of a polyimide resin. In the alternative, the fourth insulating layer 21e and the fifth insulating layer 21f may be formed of, for example, an insulating adhesive. Since the other configuration of the semiconductor device 1 of the fourth modification is the same as that of the semiconductor device 1 of the above-mentioned embodiment of the present invention, duplicate description will be omitted.

According to the semiconductor device 1 of the fourth modification, although the third insulating layer 21d is arranged between the magnetic layer 24 and the carbon layer 27, the same effect as the semiconductor device 1 of the above-described embodiment of the present invention is obtained.

(Fifth Modification)

Figure 16:
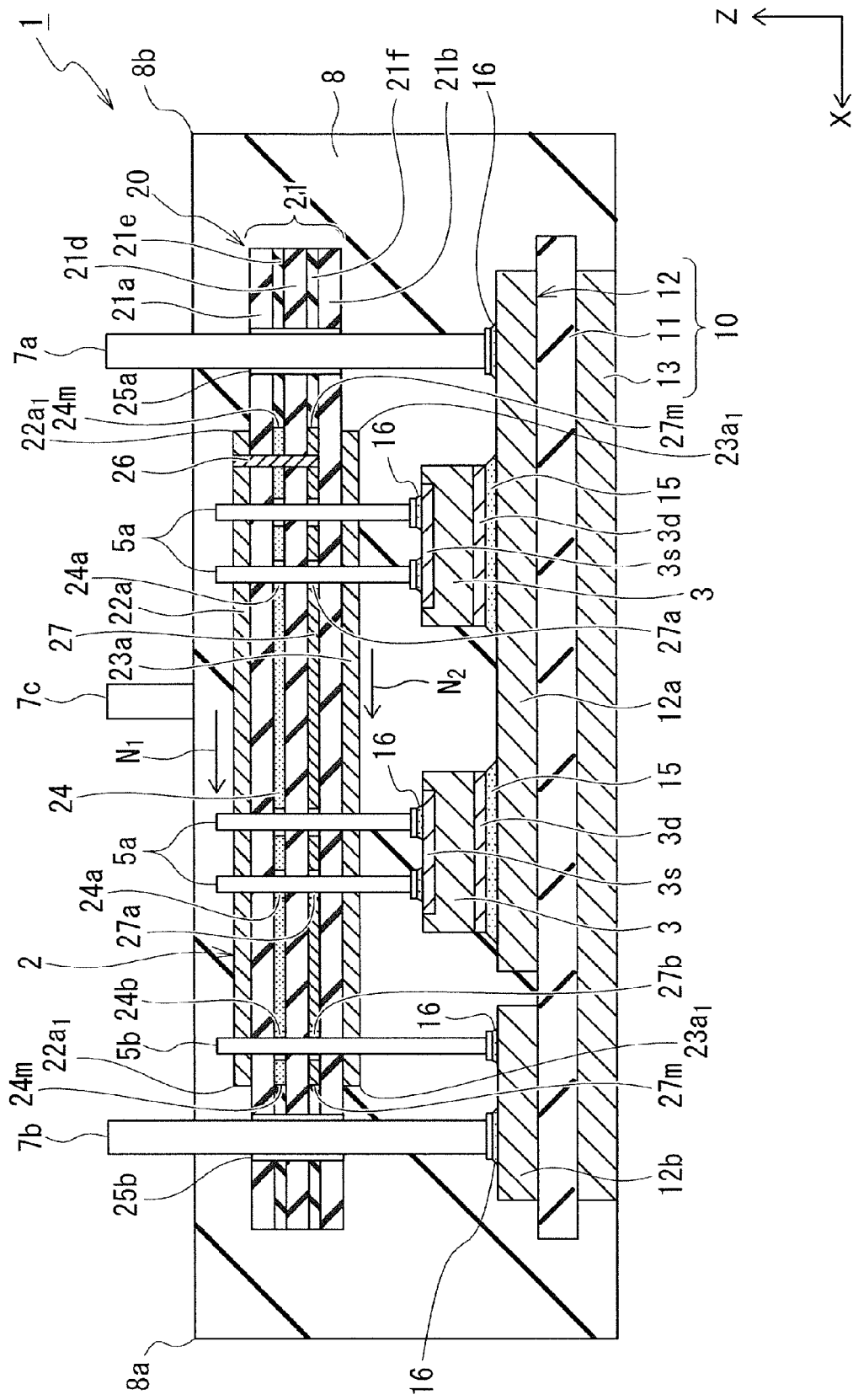
FIG. 16 is a schematic cross-sectional view showing a semiconductor device according to a fifth modification of the embodiment of the present invention.

A semiconductor device 1 according to a fifth modification of the above-mentioned embodiment of the present invention differs from the semiconductor device 1 of the above-mentioned embodiment of the present invention shown in FIG. 2 in that, as shown in FIG. 16, in addition to the magnetic layer 24 and the carbon layer 27 being reversed in position, a third insulating layer 21d is arranged between the magnetic layer 24 and the carbon layer 27. Further, a fourth insulating layer 21e is arranged around the magnetic layer 24, and a fifth insulating layer 21f is arranged around the carbon layer 27. Since the other configuration of the semiconductor device 1 of the fifth modification is the same as that of the semiconductor device 1 of the above-mentioned embodiment of the present invention, duplicate description will be omitted.

According to the semiconductor device 1 of the fifth modification, although the magnetic layer 24 and the carbon layer 27 are reversed in position and the third insulating layer 21d is arranged between the magnetic layer 24 and the carbon layer 27, the same effect as that of the semiconductor device 1 of the above-mentioned embodiment of the present invention is obtained.

(Sixth Modification)

Figure 17:
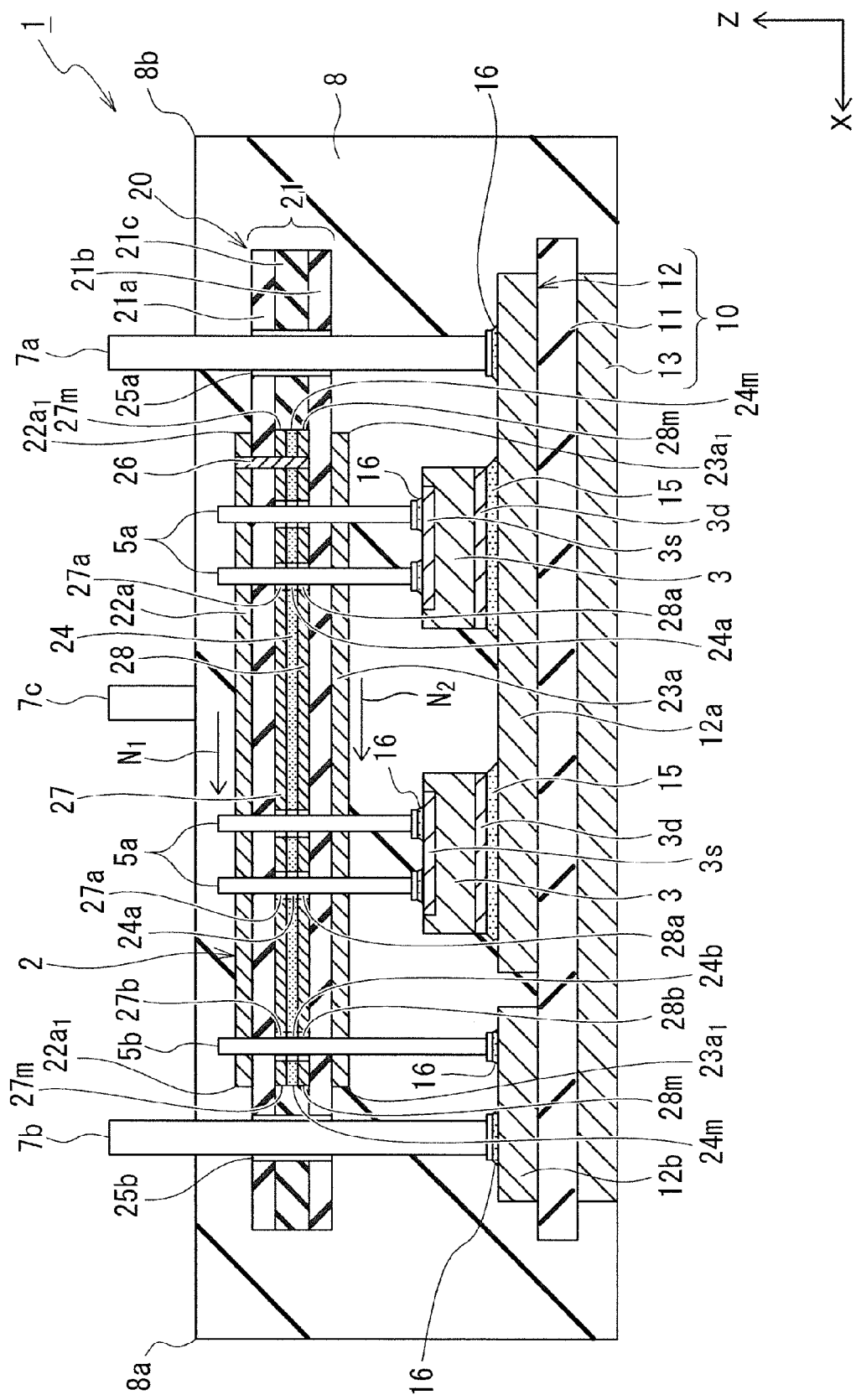
FIG. 17 is a schematic cross-sectional view showing a semiconductor device according to a sixth modification of the embodiment of the present invention.

A semiconductor device 1 according to a sixth modification of the above-mentioned embodiment of the present invention differs from the semiconductor device 1 of the above-mentioned embodiment of the present invention shown in FIG. 2 in that, as shown in FIG. 17, a plurality of carbon layers 27 and 28 are provided so as to sandwich the magnetic layer 24. The plurality of carbon layers 27 and 28 may be made of the same material, or may be made of different materials from each other. The contour 28m of the carbon layer 28 coincides with the contour 27m of the carbon layer 27 in this example, although the present invention is not limited to that. The carbon layer 28 is provided with an opening 28a so as to avoid contact with the first conductive post 5a. Since the other configuration of the semiconductor device 1 of the sixth modification is the same as that of the semiconductor device 1 of the above-mentioned embodiment of the present invention, duplicate description will be omitted.

According to the semiconductor device 1 of the sixth modification, although a plurality of carbon layers 27 and 28 are provided so as to sandwich the magnetic layer 24, the same effect as that of the semiconductor device 1 of the above-mentioned embodiment of the present invention can be obtained. In the alternative or in addition, a plurality of magnetic layers 24 may be arranged so as to sandwich a single carbon layer 27. Thus, the carbon layer 27 and the magnetic layer 24 may have different numbers of multiple layers.

(Seventh Modification)

Figure 18:
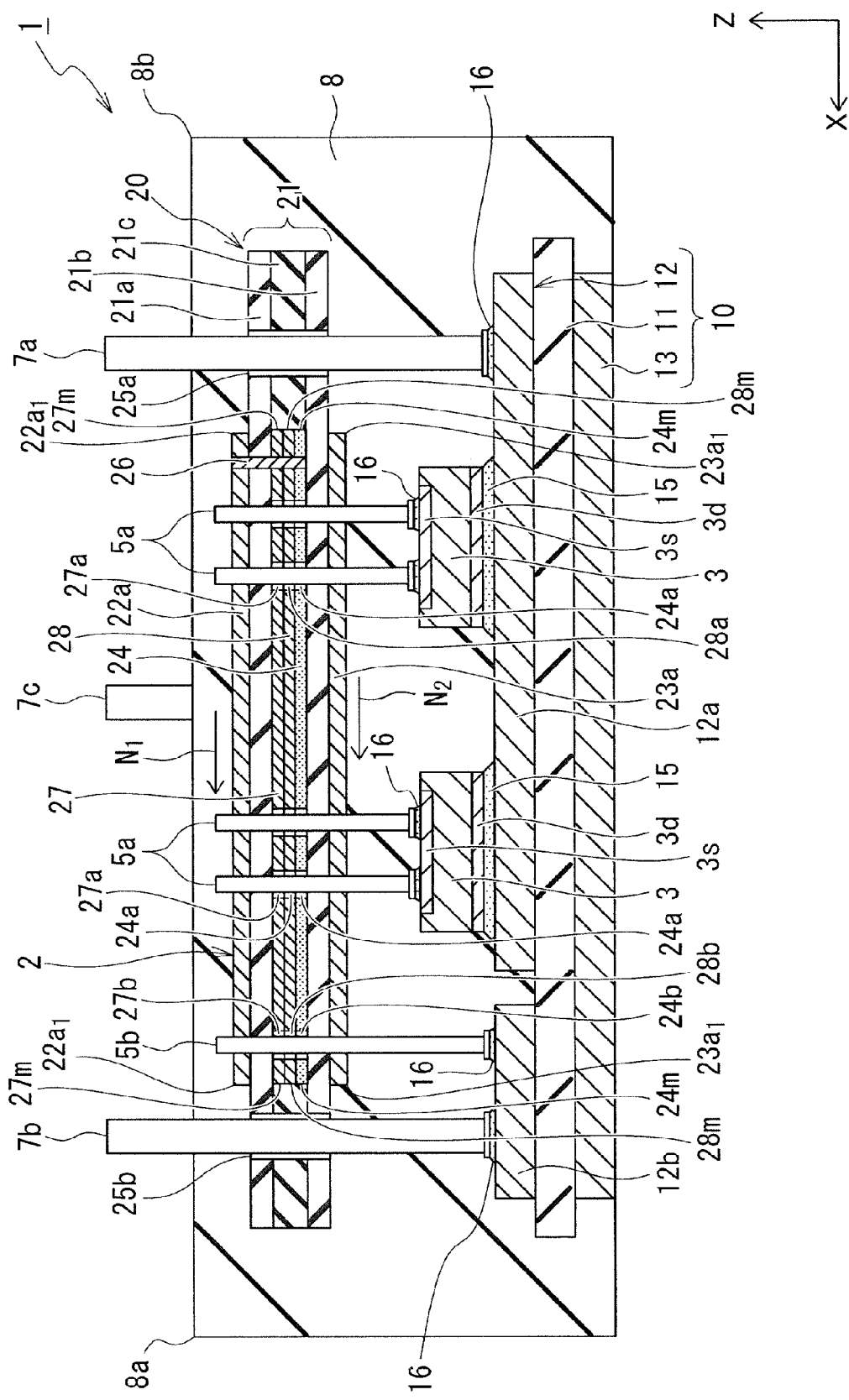
FIG. 18 is a schematic cross-sectional view showing a semiconductor device according to a seventh modification of the embodiment of the present invention.

A semiconductor device 1 according to a seventh modification of the above-mentioned embodiment of the present invention differs from the semiconductor device 1 of the above-mentioned embodiment shown in FIG. 2 in that, as shown in FIG. 18, a plurality of carbon layers 27 and 28 are laminated. The plurality of carbon layers 27 and 28 may be made of the same material, or may be made of different materials from each other. Although two carbon layers 27 and 28 are illustrated in FIG. 18, it may have three or more carbon layers. Since the other configuration of the semiconductor device 1 of the seventh modification is the same as that of the semiconductor device 1 of the above-mentioned embodiment of the present invention, duplicate description will be omitted.

According to the semiconductor device 1 of the seventh modification, although a plurality of carbon layers 27 and 28 are provided so as to be laminated, the same effect as that of the semiconductor device 1 of the above-mentioned embodiment of the present invention can be obtained. In the alternative or in addition, a plurality of magnetic layers 24 may be provided in a laminated manner.

Other Embodiments

As described above, the present invention has been described according to the embodiments and the first to seventh modifications thereof, but the statements and drawings that form part of this disclosure should not be understood to limit the present invention. Various alternative embodiments, examples and operational techniques will be apparent to those skilled in the art from this disclosure.

For example, in the above-mentioned embodiment and the first to seventh modifications, the case where the transistor element mounted in the semiconductor chip 3 is a vertical MOSFET has been described, but the present invention is not limited thereto. For example, it can be applied to a semiconductor device having a semiconductor chip in which an IGBT is mounted as a transistor element. The present invention can also be applied to a semiconductor device having a semiconductor chip in which a transistor element is mounted and a semiconductor chip in which a rectifying element is mounted.

Further, in the above-mentioned embodiment and the first to seventh modifications, the semiconductor device 1 having the substrate laminate 2 in which the wiring board 20 is supported over a single insulating circuit board 10 on which the semiconductor chips are mounted via the first conductive post 5a, the second conductive post 5b, and the third conductive post 5c has been described. But the present invention is not limited thereto. For example, it can be applied to a semiconductor device having a substrate laminate in which a wiring board is supported via conductive posts on two insulating circuit boards on which semiconductor chips are respectively mounted.

Further, in the above-mentioned embodiment and the first to seventh modifications, the magnetic layer 24 is provided with the openings 24a and 24b, and the carbon layer 27 is provided with the openings 27a and 27b, so that the magnetic layer 24 and the carbon layer 27 are not in contact with the first conductive posts 5a and the second conductive posts 5b. However, the present invention is not limited thereto, and the openings 24a and 24b of the magnetic layer 24 and the openings 27a and 27b of the carbon layer 27 may be omitted so that the first conductive posts 5a and the second conductive posts 5a that penetrate the wiring board 20 are in contact with the magnetic layer 24 and the carbon layer 27. In this case, even if the through-hole wiring 26 is omitted, the magnetic layer 24 and the carbon layer 27 can have the same potential as the first conductive layer 22a and the second conductive layer 23a.

It will be apparent to those skilled in the art that various modifications and variations can be made in the present invention without departing from the spirit or scope of the invention. Thus, it is intended that the present invention cover modifications and variations that come within the scope of the appended claims and their equivalents. In particular, it is explicitly contemplated that any part or whole of any two or more of the embodiments and their modifications described above can be combined and regarded within the scope of the present invention.

What is claimed is:

1. A semiconductor device, comprising:
    a wiring board that includes a first insulating layer, a first conductive layer arranged on a side of one main surface of the first insulating layer, a second conductive layer arranged on a side of another main surface of the first insulating layer, the wiring board further including a magnetic layer that is arranged between the first insulating layer and the first conductive layer or between the first insulating layer and the second conductive layer and that has a higher specific magnetic permeability than the first and second conductive layers, and a carbon layer that is arranged between the first insulating layer and the first conductive layer or between the first insulating layer and the second conductive layer and that has a higher thermal conductivity in a planary direction than the first and second conductive layers;
    a semiconductor chip electrically connected to the first and second conductive layers; and
    an insulating circuit board arranged separately from the wiring board and that has the semiconductor chip mounted thereon.

2. The semiconductor device according to claim 1, wherein the magnetic layer and the carbon layer are in contact with each other.

3. The semiconductor device according to claim 1, further comprising a second insulating layer arranged between the first insulating layer and the second conductive layer,
wherein the magnetic layer and the carbon layer are arranged between the first insulating layer and the second insulating layer.

4. The semiconductor device according to claim 3,
wherein one of the magnetic layer and the carbon layer is in contact with the second insulating layer, and
wherein the other of the magnetic layer and the carbon layer is in contact with the first insulating layer.

5. The semiconductor device according to claim 3, wherein the wiring board further includes a third insulating layer arranged so as to surround the magnetic layer and the carbon layer.

6. The semiconductor device according to claim 1,
wherein the magnetic layer and the carbon layer are arranged between the first insulating layer and the second conductive layer,
wherein one of the magnetic layer and the carbon layer is in contact with the second conductive layer, and
wherein the other of the magnetic layer and the carbon layer is in contact with the first insulating layer.

7. The semiconductor device according to claim 1,
wherein the wiring board further includes:
a second insulating layer arranged between the first insulating layer and the second conductive layer, and
a third insulating layer arranged between the first insulating layer and the second insulating layer,
wherein one of the magnetic layer and the carbon layer is arranged between the first insulating layer and the third insulating layer, and
wherein the other of the magnetic layer and the carbon layer is arranged between the third insulating layer and the second insulating layer.

8. The semiconductor device according to claim 1, wherein the carbon layer is provided in a plurality so as to sandwich the magnetic layer.

9. The semiconductor device according to claim 1, wherein the carbon layer is provided in a plurality so as to be in contact with each other.

10. The semiconductor device according to claim 1, wherein the first and second conductive layers are configured so that currents respectively flows through the first and second conductive layers in the same direction.

11. The semiconductor device according to claim 1, wherein the first and second conductive layers are made of a copper foil or an alloy foil containing copper as a main component.

12. The semiconductor device according to claim 1, wherein the relative magnetic permeability of the magnetic layer is 5 or more and 500,000 or less.

13. The semiconductor device according to claim 1, wherein the thickness of the magnetic layer is 10 μm or more and 50 μm or less.

14. The semiconductor device according to claim 1, wherein the magnetic layer is made of one of stainless steel foil, nickel foil, amorphous foil, permalloy foil, and FINEMET (registered trademark) foil.

15. The semiconductor device according to claim 1, wherein the carbon layer is made of graphite or graphene.

16. The semiconductor device according to claim 1, wherein an outer size of each of the magnetic layer and the carbon layer is smaller than an outer size of the first insulating layer.

17. The semiconductor device according to claim 1, wherein in a plan view, contours of the magnetic layer and the carbon layer are flush with contours of the first and second conductive layers or are located inside the contours of the first and second conductive layers.

\* \* \* \* \*